United States Patent
Palangappa et al.

(10) Patent No.: US 11,088,707 B2
(45) Date of Patent: Aug. 10, 2021

(54) LOW DENSITY PARITY CHECK (LDPC) DECODER ARCHITECTURE WITH CHECK NODE STORAGE (CNS) OR BOUNDED CIRCULANT

(71) Applicant: Intel Corporation, Santa Clara, CA (US)

(72) Inventors: Poovaiah M. Palangappa, San Jose, CA (US); Zion S. Kwok, Burnaby (CA)

(73) Assignee: Intel Corporation, Santa Clara, CA (US)

( * ) Notice: Subject to any disclaimer, the term of this patent is extended or adjusted under 35 U.S.C. 154(b) by 51 days.

(21) Appl. No.: 16/458,021

(22) Filed: Jun. 29, 2019

(65) Prior Publication Data

US 2019/0326930 A1 Oct. 24, 2019

(51) Int. Cl.
*H03M 13/11* (2006.01)
*G06F 17/16* (2006.01)

(52) U.S. Cl.
CPC ......... *H03M 13/1131* (2013.01); *G06F 17/16* (2013.01)

(58) Field of Classification Search
None
See application file for complete search history.

(56) References Cited

U.S. PATENT DOCUMENTS

| | | | |
|---|---|---|---|
| 8,499,226 B2* | 7/2013 | Gunnam | H03M 13/1128 714/786 |
| 2005/0257124 A1 | 11/2005 | Richardson et al. | |
| 2007/0220398 A1 | 9/2007 | Moon et al. | |
| 2009/0049234 A1* | 2/2009 | Oh | G06F 3/0647 711/103 |
| 2010/0241921 A1 | 9/2010 | Gunnam | |
| 2012/0233524 A1 | 9/2012 | Varnica et al. | |
| 2014/0122979 A1 | 5/2014 | Chen et al. | |
| 2016/0204865 A1* | 7/2016 | Boroson | H04B 10/1121 398/97 |
| 2018/0013446 A1 | 1/2018 | Milicevic et al. | |
| 2018/0026659 A1 | 1/2018 | Kim et al. | |
| 2018/0107591 A1* | 4/2018 | Smith | G06F 3/0679 |
| 2018/0351575 A1 | 12/2018 | Chen et al. | |
| 2019/0097656 A1 | 3/2019 | Bhatia et al. | |

(Continued)

FOREIGN PATENT DOCUMENTS

CN 103166648 A * 6/2013

OTHER PUBLICATIONS (Zhang et al), "Adaptive Decoding Algorithms for LDPC Codes", (Published 2012), IEEE (Year: 2012).*

(Continued)

*Primary Examiner* — April Y Blair
*Assistant Examiner* — Matthew W Wahlin
(74) *Attorney, Agent, or Firm* — Compass IP Law PC

(57) ABSTRACT

A low-density parity-check (LDPC) decoder has a check node storage (CNS) architecture to reduce the gate count for the decoder implementation, resulting in a lower footprint relative to traditional designs. The CNS architecture allows a controller to selectively, dynamically swap check nodes of the LDPC decoder between latching circuitry and a volatile memory. The controller can to store active check nodes in the latching circuitry and check nodes not active for a computation in the volatile memory.

19 Claims, 10 Drawing Sheets

(56) References Cited

U.S. PATENT DOCUMENTS

2019/0104078 A1* 4/2019 Kachrani ......... H04B 10/07953
2019/0190539 A1* 6/2019 Yang .................. H03M 13/1125
2019/0190543 A1* 6/2019 Young ................ H03M 13/1137

OTHER PUBLICATIONS

Leiner, "LDPC Codes—A Brief Tutorial", Apr. 8, 2005, 9 pages.
Shokrollahi, "LDPC Codes: An Introduction", Digital Fountain, Inc., Fremont, CA, Apr. 2, 2003, 34 pages.

* cited by examiner

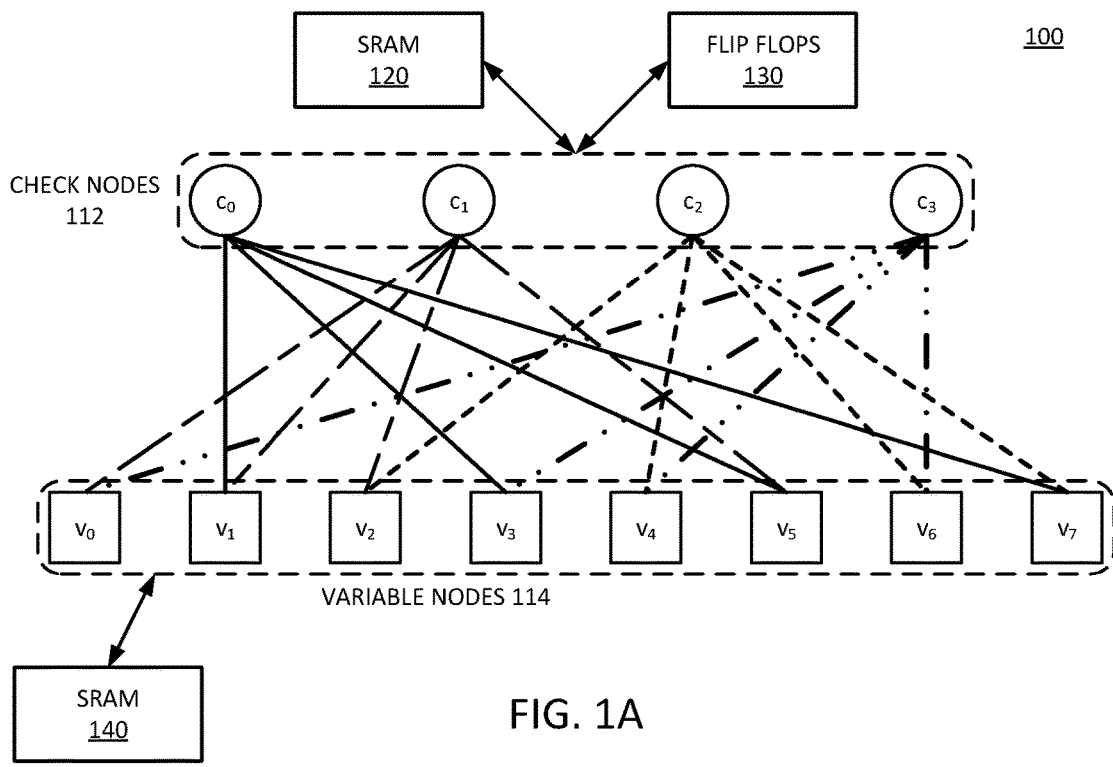
FIG. 1A
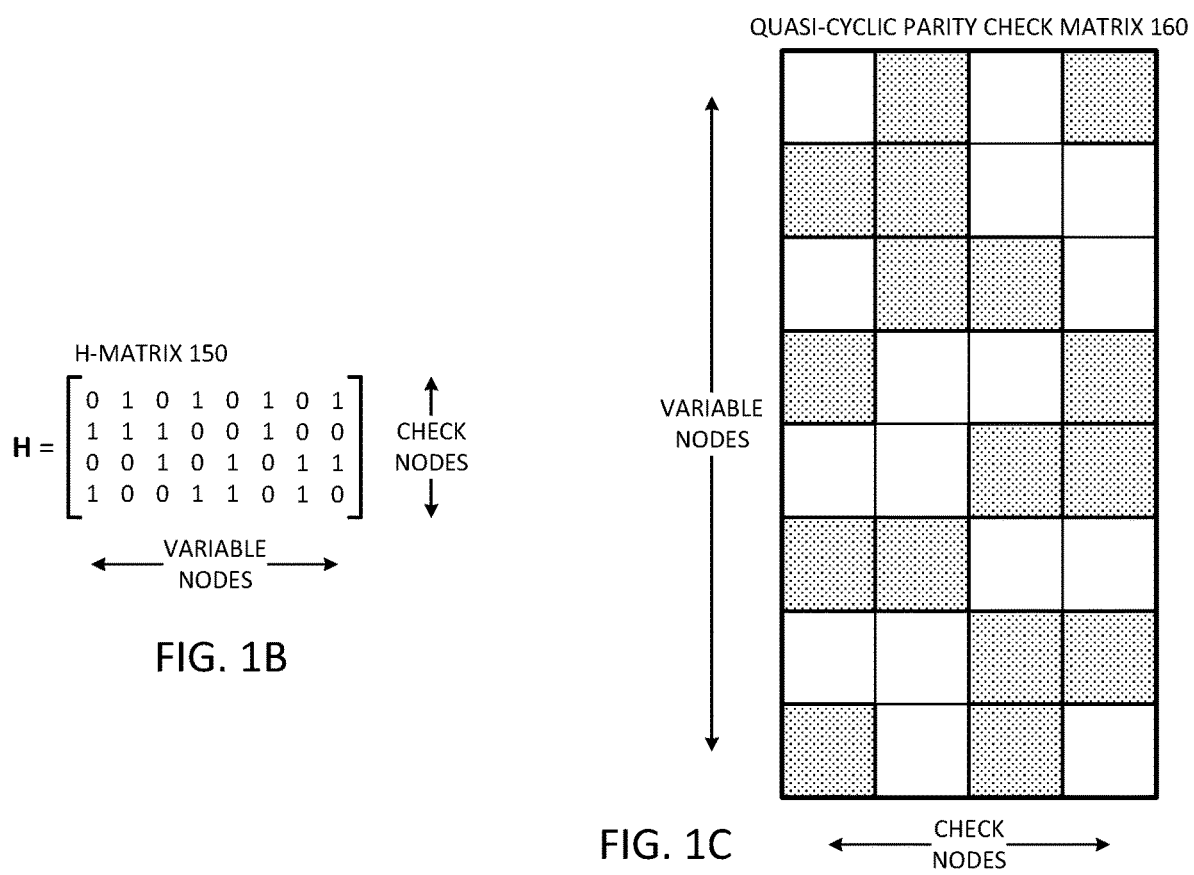
FIG. 1B
FIG. 1C

TABLE 500

| CYCLE | 1 | 2 | 3 | 4 | 5 | 6 | 7 | 8 | 9 | 10 |
|---|---|---|---|---|---|---|---|---|---|---|
| READ PORT | R11 | R12 | R13 | R21 | R22 | R23 | R31 | | | |
| WRITE PORT | | | | W11 | W12 | W13 | W21 | W22 | | |
| CHECK BUF 1 | R11 | R11 | R11 | R21 | R21 | R21 | | | | |
| CHECK BUF 2 | | R12 | R12 | R12 | R22 | R22 | | | | |
| CHECK BUF 3 | | | R13 | R13 | R13 | R23 | | | | | ered. Additionally, high density nonvolatile memories (NVM) such as NAND (also popularly known as flash memory) and 3DXP (three-dimensional crosspoint, or other resistive memory technology) are inherently noisy media. In noisy storage media, there is a statistically significant probability that a bit written and then later read will be in error.

LOW DENSITY PARITY CHECK (LDPC) DECODER ARCHITECTURE WITH CHECK NODE STORAGE (CNS) OR BOUNDED CIRCULANT

FIELD

Descriptions are generally related to a decoder, and more particular descriptions are related to decoder architecture with low footprint design.

BACKGROUND

Low density parity check (LDPC) codes provide parity checking with low latency decoding and the ability to use soft information to improve decoding. LDPC decoders have two sets of nodes: check nodes and variable nodes. Traditional LDPC decoder architectures require check nodes to be available at every clock cycle, which suggests storing the nodes in latches or flip flops. The longer the codeword length for an LDPC code, the better the decoding performance tends to be.

However, flip flops are an expensive means to store data, because flip flops require a significant number of gates to store a bit, relative to the gate count needed for random access memory (RAM) storage, such as SRAM (synchronous RAM). RAM storage uses less space to store data, but is too slow for an application of a practical decoder. A large fraction of the area of a traditional decoder is utilized to just store the check nodes using flip flops. In traditional decoders, the check nodes account for nearly 50% of the size of the decoder.

As system design moves towards LDPC codes with longer block lengths, the size of the decoder keeps increasing. The longer codes increase the gate counts of the decoders to numbers that are prohibitively high for practical implementations due to the gate count, power, and physical design requirements. Traditional decoder implementations have a very high footprint, or size of silicon die area needed for the decoder.

BRIEF DESCRIPTION OF THE DRAWINGS

The following description includes discussion of figures having illustrations given by way of example of an implementation. The drawings should be understood by way of example, and not by way of limitation. As used herein, references to one or more examples are to be understood as describing a particular feature, structure, or characteristic included in at least one implementation of the invention. Phrases such as "in one example" or "in an alternative example" appearing herein provide examples of implementations of the invention, and do not necessarily all refer to the same implementation. However, they are also not necessarily mutually exclusive.

FIG. 1A is a block diagram of an example of a Tanner graph for a system in which check nodes are selectively stored in memory or latches.

FIG. 1B is a representation of an H-matrix for the Tanner graph of FIG. 1A.

FIG. 1C is a block diagram of an example of a parity check matrix for the Tanner graph of FIG. 1A.

Figure 2:
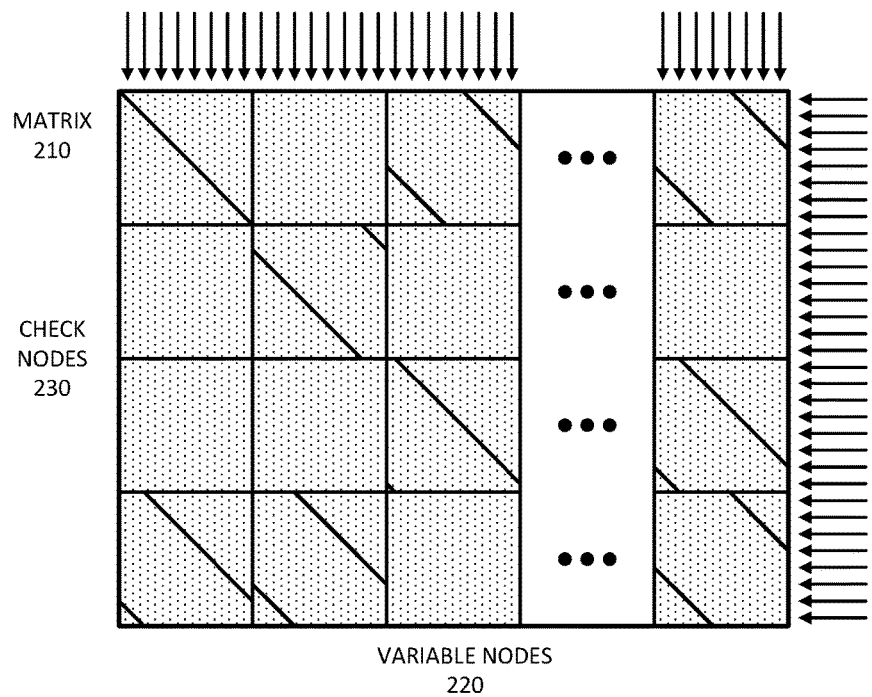
FIG. 2 is a representation of an example of a quasi-cyclic parity check matrix for a system in which check nodes are selectively stored in memory or latches.

Descriptions of certain details and implementations follow, including non-limiting descriptions of the figures, which may depict some or all examples, and well as other potential implementations.

DETAILED DESCRIPTION

As described herein, a low-density parity-check (LDPC) decoder has a check node storage (CNS) architecture. With a CNS architecture, the system offloads inactive check nodes (CNs) into volatile memory, such as SRAM (synchronous random access memory). The variable nodes (VNs) can be accessed from volatile memory and the CNs can be selectively loaded into latches from volatile memory and offloaded from the latches back into volatile. Thus, active check nodes can be stored in latches or flip flops and inactive check nodes can be stored in volatile memory.

The CNS architecture allows a controller to selectively and dynamically swap check nodes of the LDPC decoder between latching circuitry and the volatile memory. The controller can to store active check nodes in the latching circuitry and check nodes not active for a computation in the volatile memory. Selectively loading and offloading the check nodes enables the system to be architected with fewer latching circuits to store the check nodes. The reduction in the use of latching circuitry results in an overall reduction in the gate count for the decoder implementation, resulting in a lower footprint relative to traditional designs.

LDPC encoding and decoding can be used in noisy environments to reduce the error rate in transmission of a signal. High-speed, high-bandwidth communication systems such as optical communication, video communication, memory subsystems, or other systems, have high noise for the transmission of signal data. In high speed communication, there is a statistically significant probability that a data bit transmitted is received in error. Additionally, high density nonvolatile memories (NVM) such as NAND (also popularly known as flash memory) and 3DXP (three-dimensional crosspoint, or other resistive memory technology) are inherently noisy media. In noisy storage media, there is a statistically significant probability that a bit written and then later read will be in error.

The raw bit error rate (RBER) can refer to the error rate of the transmission system or storage device, or the bit error rate (BER) prior to correction. The RBER can be reduced to acceptable error rates in a system by the application of error correction. Error correction can maintain the error rate at acceptable levels to enable higher transmission rates for data transfer or enable higher data density (bits per area) of a storage medium. Error correction is typically applied through error correction codes (ECC, which can alternatively be referred to as error correcting codes or error correction coding, or other alternatives). ECC applies a code overhead to the signal transmitted/stored to manage error rates within levels acceptable by the specific system in which it is implemented.

LDPC codes are a class of ECC codes that can provide low latency decoding, support soft information decoding, and can achieve capacity. LDPC codes are generally specified using a parity-check matrix (e.g., an H matrix), which computes the syndrome (error signature consisting of a bit vector) for a noisy codeword. Any codeword whose syndrome is zero is considered to be a valid codeword. The process of decoding with LDPC codes includes iteratively moving from a noisy codeword (i.e., a syndrome that is not all zeros) to a corrected codeword (i.e., the syndrome is all zeros). There are several examples of decoding algorithms like bit-flip decoder, layered decoder, sum-product decoders, belief-propagation decoders, and others.

A min-sum (MS) decoder is a type of message passing decoder that uses the messages or reliabilities from the connected bits or connected nodes (which can be referred to as neighbors) to evaluate the reliabilities of the given node. The operation performed to evaluate the reliability of a variable node is a sum of all the neighbors' messages, and the operation to evaluate the reliability of a check node is a min (taking the minimum value) of all the neighbors' messages. Practical LDPC codes typically have fewer check nodes compared to the variable nodes for an operation. In light of this typical relationship, check nodes provide a natural place to break iterations into clock cycles, which suggests storing the check nodes in latches or flip flops.

Flip-flops typically use more silicon area per bit than SRAM devices. A bit stored in a flip flop typically requires about 10-20 gates, whereas a bit stored in SRAM typically requires only 1-4 gates. It is possible to design a decoder where all check nodes are stored in SRAM storage for all applications, referring to an architecture where the computations on the check nodes are not performed directly from the SRAM. However, such a design would require a drastic change to the microarchitecture of a min-sum decoder. Additionally, using only SRAM storage for the check nodes would require multiple read ports, and would require a very shallow SRAM. The consequences of the requirements for multiple read ports and a very shallow SRAM would result in higher silicon area use per bit than an implementation in flip-flops.

As systems move toward LDPC codes with increasingly longer block lengths, the size of the decoder continues to increase as the hardware for computations increases with the increase in the number of bits involved. With current decoder designs, large LDPC decoders can have gate counts in the multiple millions of gates for the check node storage. The increasing decoder size increases the power, area, and physical design effort required for the decoder. A large fraction of the area of the decoder is utilized simply to store the check nodes using flip flops. Since the existing architectures need all the check nodes to be available at every clock cycle, it is necessary to store them in flip flops, or alternatively, in SRAM that would have an even higher silicon cost.

As described herein, in one example, a controller dynamically moves check nodes between the volatile memory array (e.g., an SRAM) and the latching circuitry (e.g., flip flops) based on whether the check nodes are active for an H-matrix operation. Storing the check nodes in SRAMs instead of flip flops reduces the footprint of the decoder, and selectively, dynamically trading check nodes between volatile memory and latching circuitry maintains needed availability for decoding operations. The reduced gate count reduces the silicon area needed. These reductions can result in lower power usage and higher performance for systems constrained by thermal limits.

It will be understood that by taking inactive check nodes out of latching circuitry and into volatile memory, the system loses some ability to speed up the decoding operation because of the need to swap the check nodes. However, for systems where speed of decoding operation is not the primary factor, the advantage of a much lower decoder footprint can be an acceptable tradeoff.

In an implementation of an LDPC system, the LDPC code can be specified by a quasi-cyclic parity-check matrix (the H-matrix), which has rows and columns of square cyclic submatrices (circulants) that are typically identity matrices rotated by varying offsets. In one example, the circulants of the codeword are constrained to where non-zero values can be stored. Constraining the circulants can reduce the circulant size, which will constrain the check nodes that need to be active during any clock cycle. In one example, the system stores the inactive check nodes in SRAM and incrementally activates them by reading them from SRAM into a circular buffer composed of flip-flops as needed.

It will be understood that by constraining where the circulants can include non-zero values, there is some loss of code design flexibility. However, the constrained circulants can reduce the footprint without as much impact on the speed up capability of the decoding operation. For systems that can tolerate less flexibility in code design, the size and power gains achieved by constraining the circulants can be an acceptable tradeoff.

FIG. 1A is a block diagram of an example of a Tanner graph for a system in which check nodes are selectively stored in memory or latches. The Tanner graph in system 100 represents the LDPC decoding based on relationships or messaging between nodes. Check nodes 112 are represented together as one set of nodes, and variable nodes 114 are represented as a separate set of nodes. The lines between specified nodes represents the messaging or message passing for the decoding.

LDPC decoding performs message passing to share bit-reliabilities between nodes. Variable nodes 114 represent the input code word, and can alternatively be referred to as bit nodes. The input code word can be the bits from the media (e.g., NAND, 3DXP, or other storage media, or a communication line). Check nodes 112 represent the bits of the parity check equation, and can alternatively be referred to as function nodes.

The line or connection between two nodes represents a non-zero element in an LDPC H-matrix (illustrated in FIG. 1B). It will be observed that check nodes 112 are numbered c[0:3] and the variable nodes are numbered v[0:7], representing a (8,4) LDPC code. As an example of the coding, consider CN c0, which has connections to v1, v3, v5, and v7, representing 1's in columns 1, 3, 5, and 7 on row 0. For row 1, the connections from c1 to v0, v1, v2, and v5 indicate 1's in columns 0, 1, 2, and 5.

Referring to FIG. 1B, H-matrix 150 is a representation of an H-matrix for the Tanner graph of FIG. 1A. H-matrix 150 provides an LDPC matrix definition of the mapping illustrated by the Tanner graph of system 100.

H-matrix 150 is an n×m matrix with n=8 rows by m=4 columns for a (8,4) code. For a low density matrix, the number of ones per row on average should typically not be more than half the number of nodes per row, and the number of ones per column on average should typically not be more than half the number of nodes per column.

H-matrix 150 has rows corresponding to the check nodes and columns corresponding to the variable nodes. Row 0 is [0 1 0 1 0 1 0 1], corresponding to c0→{v1, v3, v5, v7}, meaning c0 is connected to the v-nodes in the brackets. Row 1 is [1 1 1 0 0 1 0 0], corresponding to c1→{v0, v1, v2, v5}, Row 2 is [0 0 1 0 1 0 1 1], corresponding to c2→{v2, v4, v6, v7}, and Row 3 is [1 0 0 1 1 0 0 1], corresponding to c3→{v0, v3, v4, v6}, As such, each column has two non-zero check nodes, and each row has four non-zero nodes.

H-matrix 150 represents a regular LDPC matrix given that all rows and columns have an equal number of non-zero nodes. While not specifically illustrated, the H-matrix could alternatively be an irregular matrix, in which the average number of non-zero nodes is the same, but there are columns or rows (or both columns and rows) that have different numbers of non-zero nodes.

Referring to FIG. 1C, matrix 160 is a graphical representation of an example of a parity check matrix for the Tanner graph of FIG. 1A. Whereas H-matrix 150 illustrates the matrix definition, matrix 160 illustrates a matrix representation with each box representing a location or node in the matrix, with shaded boxes being non-zero and the white spaces being zeros. Each column corresponds to a variable node or bit node, and each row corresponds to a parity check equation or check node. Each non-zero element in the matrix represents a connection between these two types of nodes.

Matrix 160 is illustrated from a perspective that the column on the left as looking at the diagram on the page represents check node c0, the column to the right is c1, and so forth. The row starting at the top left of the matrix as oriented on the page represents v0, the next row down represents v1, and so forth.

Returning to FIG. 1A, system 100 includes representations of SRAM 120 and flip flops 130 as alternative storage locations for check nodes 112. SRAM 120 represents a volatile memory array to store data. The memory array can be a standalone device or a memory circuit integrated onto an ECC circuit. Variable nodes are stored in SRAM 140. While SRAM 120 and SRAM 140 are specifically identified, it will be understood that a different type of volatile memory could be used, such as DRAM (dynamic random access memory). While flip flops 130 are specifically identified, it will be understood that other latching hardware could be used. Both a latch and a flip flop can be considered latching circuits, where a latch typically automatically propagates an output in response to an input, and a flip flop synchronizes the output in response to an input based on a clock signal.

In system 100, variable nodes 114 are stored in SRAM 140 and data for the variable nodes is loaded from the SRAM to perform decoding operations. In system 100, a controller moves check node data stored in flip flops 130 to SRAM 120 when they are not active. For example, the flip flops can include multiple flip flop circuits each to store an active check node. SRAM 120 is a much less expensive storage medium than flip flops 130. Use of SRAM 120 reduces the gate count of the entire decoder since check nodes themselves occupy approximately 50% of the decoder area.

In one example, the application of the decoder is as an ECC decoder for either NAND memory or a 3DXP memory ASIC controllers. The ECC decoder contributes to a significant part of the full-chip area, power count, and physical design, which all translate to additional cost and tie to market. By reducing the size of the LDPC decoders, a system can provide the same quality of error correction performance for lower cost and quicker time-to-market as compared to traditional LDPC decoders.

In a system implementing the LDPC decoder described herein would include additional SRAM arrays in an ECC circuit and would include less flip flop circuitry. The size and aspect ratio of the SRAM arrays can include a geometry dependent on the LDPC code used. In one example, the read port for the SRAM would be connected to k sets of buffers for an H matrix with column weight k (e.g., k=3). The k sets of buffers can correspond to the size of a circulant row's check nodes. In one example, the decoder circuit will include adders that would be connected to a partial sum, and would include subtractors connected to a complete sum with associated barrel shifters. In one example, the adders would be in multiples of the circulant size (e.g., 512). In one example, the write port of the SRAM would be connected to the output of the subtractors.

In one example, the decoding latency of a decoder in accordance with what is described herein can be measured as being different from a traditional decoder, even though it would be functionally equivalent to a traditional LDPC decoder design. In one example, the decoding latency takes k clock cycles to process one column of the H matrix with column weight k. One full iteration would be expected to take k* (number of circulant columns). In one example, measuring the latency of a 0 bit error or 1 bit error may give the latencies of 1 and 2 iterations, respectively. Typically, the location of the 1 bit error does not matter, but if it changes the latency there may be early exit logic to avoid completing the decoding. In such a case, the system can use the largest latency for the 1 bit error case. In one example, subtracting the latencies of 1 and 2 iterations gives the latency for one full iteration.

FIG. 2 is a representation of an example of a quasi-cyclic parity check matrix for a system in which check nodes are selectively stored in memory or latches. In general, an LDPC code is specified by a parity check matrix (an H-matrix), illustrated by matrix 210. Matrix 210 provides an example of an LDPC matrix that can be implemented with check nodes swapped between volatile memory and latching circuitry in accordance with FIG. 1A.

In one example, matrix 210 is a quasi-cyclic structure. The individual squares in the matrix indicate rows and columns, or nodes in the matrix. The lines within specific square indicate non-zero elements in the H matrix, and form cyclic patterns within square submatrices. The square submatrices can be referred to as circulants. It will be observed that the quasi cyclic pattern includes non-zero elements in the location of an identity matrix, with offsets.

In general, an identity matrix includes non-zero elements along the main diagonal and all other values are zero. The main diagonal refers to a node in the matrix where row number and columns number are equal (i.e., at (0,0), (1,1), (2,2), . . . ). An identity matrix with offsets can introduce an offset into one of the numbers. For simplicity, consider a 4×4 matrix which would normally have an identity matrix with non-zero elements at (0,0), (1,1), (2,2), (3,3). If the identity matrix had an offset of Column Number+1, the non-zero elements would be at the diagonals as located at (0,1), (1,2), (2,3), (3,0). If the identity matrix had an offset of Row Number+2, the non-zero elements would be at the diagonals as located at (2,0), (3,1), (0,2), (1,3). Any offset combination is possible to offset the diagonals of the non-zero elements in the submatrix. As will be observed from matrix 210, different submatrices can have different offsets. Thus, one submatrix may have an offset of +1, and another of +2, for example. There is no specific restriction to the use of offsets.

Matrix 210 is illustrated as having four rows, but it will be understood that the matrix can have more or fewer than four rows. The four row example is simply for purposes of illustration. It will be observed that the last column has three rows with non-zero nodes or submatrices with non-zero elements. As such, matrix 210 can be considered an irregular LDPC matrix. In alternative implementations matrix 210 is a regular matrix.

Matrix 210 includes check nodes 230 and variable nodes 220. The arrows along the edges of the matrix represent iterations of the decoding operation. More specifically, there will be a number of arrows depending on the number of rows and columns that are in the submatrix. The total number of arrows for the entire matrix will correspond to the total numbers of rows and columns.

Figure 3:
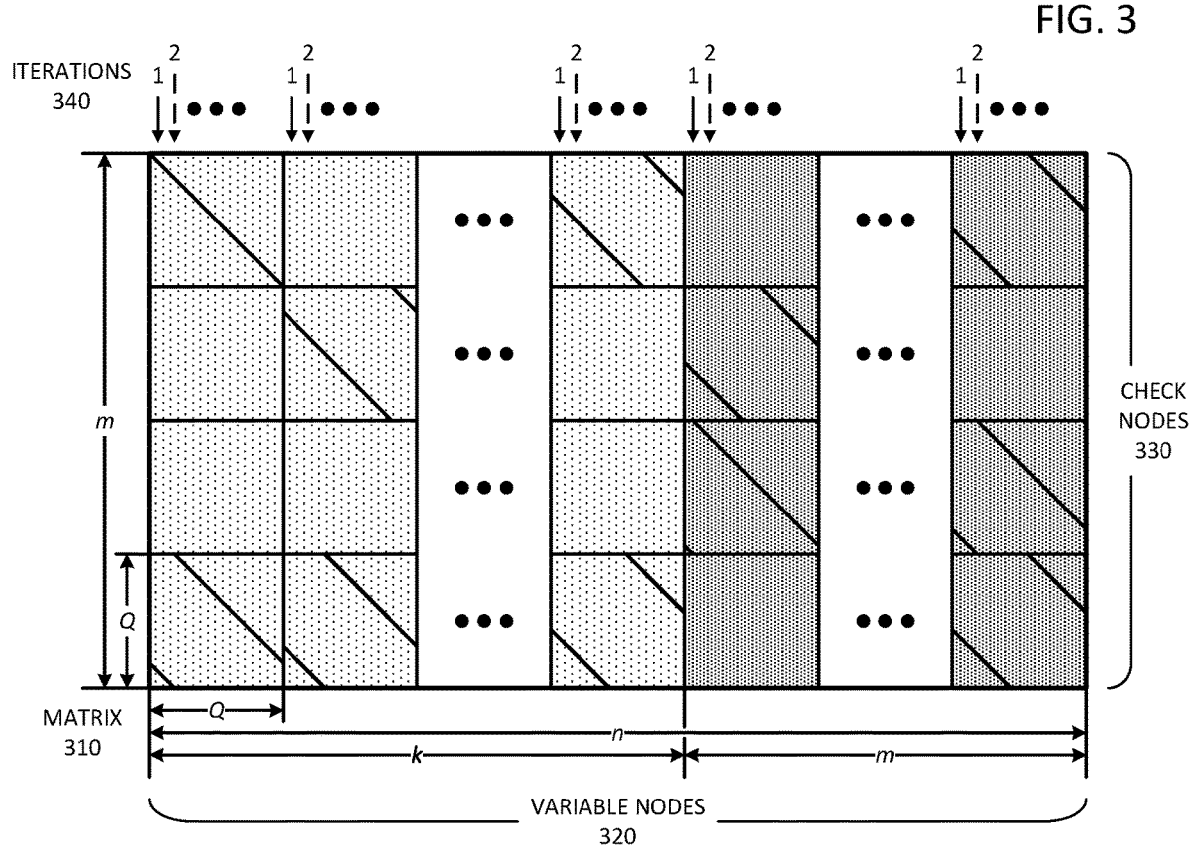
FIG. 3 is a representation of an example of a quasi-cyclic parity check matrix organized as sub-matrices.

FIG. 3 is a representation of an example of a quasi-cyclic parity check matrix organized as sub-matrices. Matrix 310 provides an example of an LDPC matrix that can be implemented with check nodes swapped between volatile memory and latching circuitry in accordance with FIG. 1A. Matrix 310 can be one example of a matrix in accordance with matrix 210 of FIG. 2.

During LDPC decoding using a min-sum algorithm, a belief propagation (SPA) algorithm, or a bit flipping algorithm, the decoder typically passes messages between variable nodes 320 and parity check nodes 330. The exchange of messages takes multiple iterations. Each iteration usually takes multiple clock cycles, referred to as sub-iterations. There are different ways to schedule the processing within each sub-iteration. Matrix 310 illustrates an architecture in which messages can be passed between variable nodes and check nodes that correspond to a square sub-matrix or circulant in one sub-iteration.

In one example, iterations 340 represent the various iterations of the decoding operations or decoding algorithm. As described in more detail below with respect to FIG. 4, in one example, the iterations can be local to a circulant column or can be applied across the columns. While shown as iterations 1, 2, . . . , in the diagram, the operations can be applied across all columns (e.g., all columns operate during iteration 1, then all columns operate during iteration 2, and so forth) or within a column (e.g., the operations are completed on the entire column before advancing to perform operations on a subsequent column). The sizing of the circulants can be made in accordance with the anticipated number of clock cycles for the operations. An operation includes passing a message and performing a computation to determine the syndrome for a given bit. In one example, the decoder processes a subset of variable nodes from each circulant in a sub-iteration.

The darker shading of the circulants to the right side of matrix 310 represents the sub-division of matrix 310 and relative sizing of columns versus rows. Matrix 310 can be identified as an m×n matrix, which identifies the submatrix size rather than the actual size. Each submatrix or circulant as illustrated is a square matrix of size Q×Q. Thus, the number of check nodes 330 is m=p*Q, where Q is the submatrix size and p is a multiplier to indicate the number of rows of circulants. There are four rows illustrated, but p can be any integer. It will also be understood that for a given matrix size m, it can be subdivided into different numbers of submatrices for purposes of decoding computations. Thus, Q can change, which would change the number of circulant rows.

Similarly, the number of variable nodes 320 is n=r*Q, where Q is the submatrix size and r is a multiplier to indicate the number of columns of circulants wherein r is an integer greater than p. It will also be observed that n=k+m, where k is an integer greater than m. As with the row number, the number of columns can be adjusted by performing computations on matrix 310 in accordance with a different value of Q.

Figure 4:
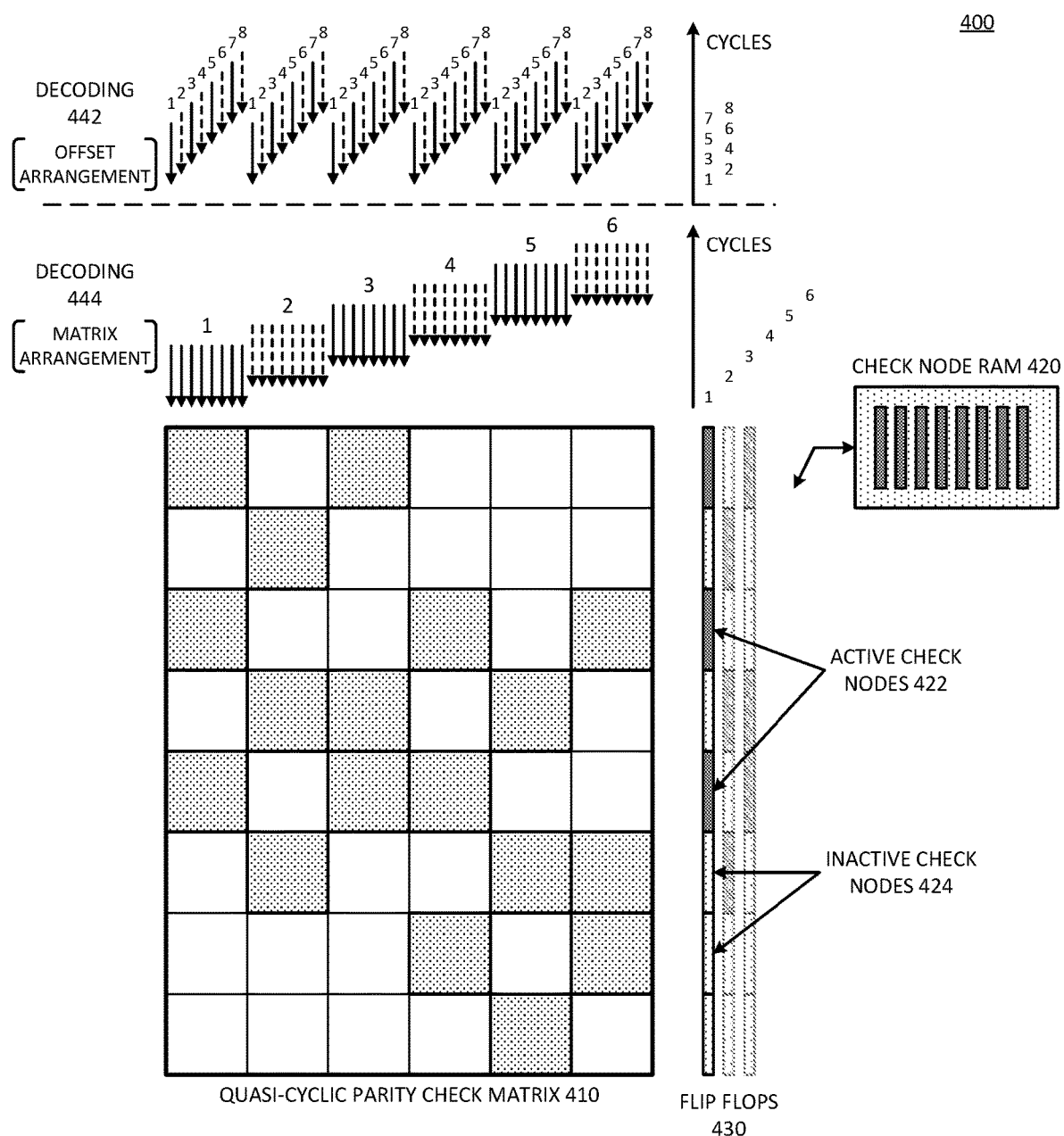
FIG. 4 is a representation of an example of an architecture for a check node storage (CNS) system with a quasi-cyclic parity check matrix.

FIG. 4 is a representation of an example of an architecture for a check node storage (CNS) system with a quasi-cyclic parity check matrix. Matrix 410 is a quasi-cyclic parity check matrix, where the decoder performs decoding operations in accordance with multiple circulants. Matrix 410 provides an example of an LDPC matrix that can be implemented with check nodes swapped between volatile memory and latching circuitry in accordance with FIG. 1A.

Codewords currently in use can be as large as 4 KB or 16 KB, which means currently all bits cannot be processed at once in a practical system. Instead of processing all bits at once, the system can schedule the processing of only a fraction of the bits in a given clock cycle, iterated through all bits in the codeword. Thus, an iteration of the LDPC decode can be spread across multiple clock cycles.

Decoding 442 illustrates an offset arrangement for processing the codeword, where the $i^{th}$ sub-column of every circulant clock is processed in the $i^{th}$ clock cycle. Once all the columns are processed, an iteration is complete. The advantage of the offset arrangement is that it is easy to implement since every sub-column's connections are identical in a quasi-cyclic matrix. The disadvantage is that all the check nodes are active at all clock cycles.

In accordance with what is described herein, only active check nodes are stored in flip flops 430. System 400 can perform decoding in accordance with decoding 444, which illustrates a matrix arrangement for processing the codeword. The matrix arrangement increases the complexity of scheduling of columns to process as compared to decoding 442. Decoding 444 in matrix arrangement provides an advantage in that it creates locality in the check nodes, which means only a small number of check nodes need to be active at any given clock cycle.

In one example, system 400 stores active check nodes 422 in flip flops 430 and moves inactive check nodes 424 to one or more volatile memory arrays, represented by check node RAM 420. In system 400, as with previous diagrams, shaded boxes indicate nodes with non-zero values for matrix 410, and all other areas of matrix 410 are zero. It will be observed that flip flops store the active nodes for a particular iteration. For illustration, an outline of the active and inactive check nodes for cycle 2 and cycle 3 are provided. What is illustrated in solid line in system 400 represents the active check nodes for the first cycle, each of which can include multiple clock cycles and multiple operations.

The depth of RAM 420 depends on the amount of storage needed for the inactive check nodes. A deeper RAM allows for more inactive CNs to be stored. For example, consider that there may be 512 CNs for matrix 410. Having 512 CNs with a relatively small percentage active for any given operation means that the depth of RAM 420 may be higher. Splitting the 512 into two sets of 256 results in more CNs active per clock cycle. Thus, the number of inactive CNs goes down as the number of active elements increases. Thus, moving inactive CNs into volatile memory allows for flexibility in using less latching circuitry. The amount of circuitry can be flexibly deployed for a system implementation depending on how much power and latching circuitry want to be traded off for volatile memory usage. The speed up of the decoding computation may go down with increased volatile memory usage, but the amount of volatile memory usage and latching circuitry usage can be flexibly applied based on the system implementation.

In the offset arrangement of decoding 442, the decoder decodes the first sub column of every circulant column in a cycle. In one example, the CNS architecture decodes in matrix arrangement of decoding 444 where all sub-columns of a circulant column are decoded in a cycle. Processing the data in a matrix arrangement instead of the offset arrangement creates locality in the check nodes. The computation algorithm only needs a fraction of the check nodes active at a given time. Active check nodes 422 (dark shading) can be stored in flip flops 430, while inactive check nodes 424 (lighter shading) can be stored in check node RAM 420, which represents a volatile memory array.

Matrix 410 defines the connections between VNs and CNs. In a min-sum decoder, the nodes share LLR (log likelihood ration) information. The variable nodes compute a sum on the LLR information passed, while the check nodes compute a min. The minimum reliability of any column is the reliability of the matrix. In one example, the computations for matrix 410 can complete in six clock cycles for a matrix arrangement, as opposed to eight clock cycles for the offset arrangement. To store the bit and the reliability information for sharing, each CN may require approximately 10-20 gates for a flip flop. Even using only active CNs, there may be approximately 512 active CNs for an operation. Thus, it will be understood that reducing the flip flop storage to active CNs can significantly reduce the overall decoder footprint when there will typically be more inactive CNs per operation than active CNs.

Figures 5, 6:
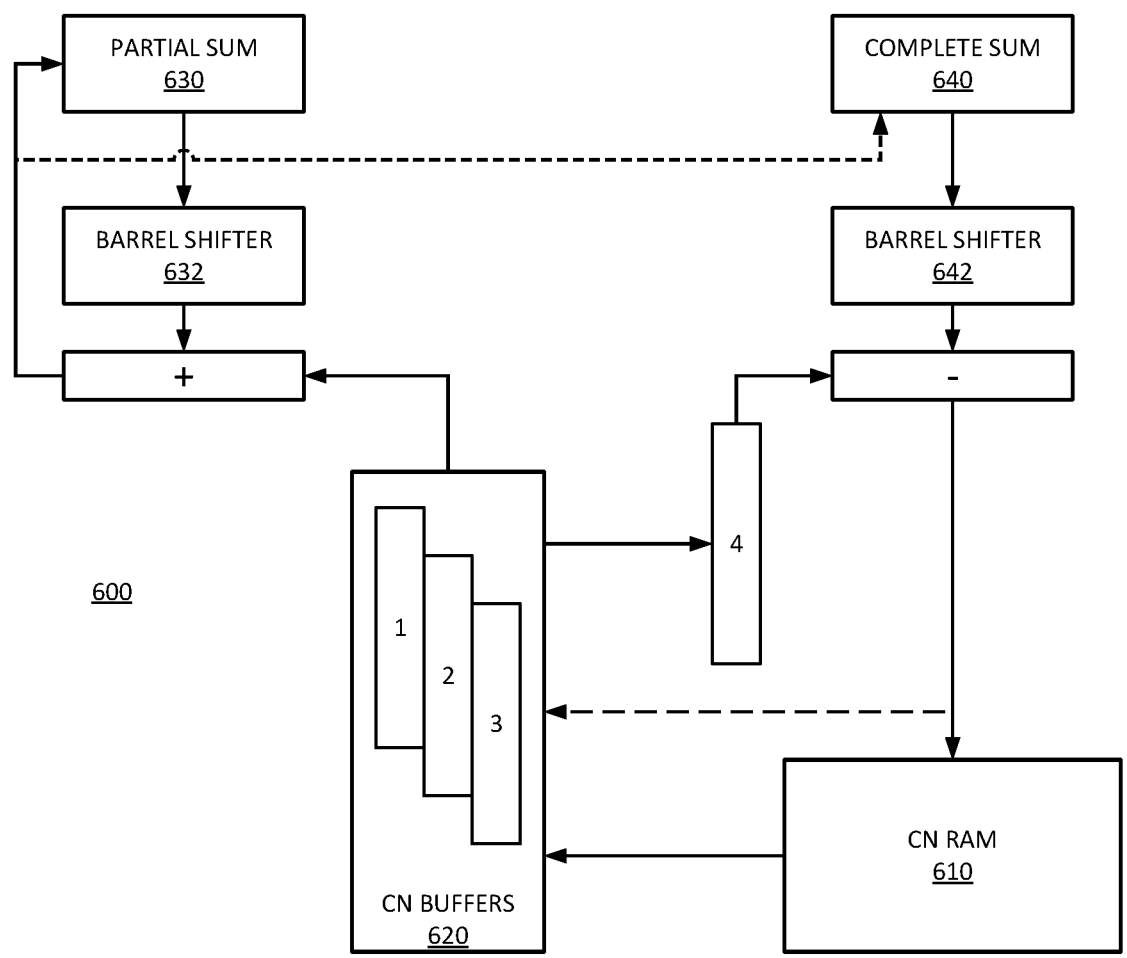
FIG. 5 is a representation of an example of a table indicating read and write procedures for a CNS architecture.
FIG. 6 is a block diagram of an example of a CNS architecture.

FIG. 5 is a representation of an example of a table indicating read and write procedures for a CNS architecture. Table 500 represents the data flow sequence of events for a CNS architecture such as the CNS architecture of system 400. In table 500, the letter indicates the command type, 'R' for reads and 'W' for writes. The first digit after the command type indicates the column index. The second digit after the command type indicates the row intersection. Thus, for example, "R12" indicates a read with column index '1' and a row intersection '2'.

In one example, at the beginning of an iteration, the decoder hardware provides the check node data corresponding to the first column and its first incident row (R11) to a buffer and computes a partial sum with the data. In the next cycle, the check buffer 2 is populated with the check node data corresponding to the next incidence of the same column (R12) and the decoder updates the partial sum. Once the decoder completes all the incidences of the row, the decoder stores in SRAM the sum minus the self message for the column 1 incidence 1 (W11). In the same clock cycle the decoder writes the check node data corresponding to the next column and first incidence (R21) to the check buffer. This sequence can go on until all columns of the matrix are processed.

FIG. 6 is a block diagram of an example of a CNS architecture. System 600 represents an example microarchitecture of the sequence illustrated in table 500. In one example, system 600 includes check node (CN) RAM 610 to store inactive check nodes. In one example, CN RAM 610 is a 1R1W SRAM.

CN (check node) buffers 620 cache data from CN RAM 610 that are only required for a current computation. Such operation creates locality in the check nodes due to decoding in code word arrangement instead of decoding in offset arrangement. CN buffers 620 illustrates buffer labeled 1, 2, and 3. The three buffers illustrated correspond to a column weight 3 in the LDPC codes. An implementation that has different column weights can use a different number of CN buffers (e.g., 4, 5, or some other number). In the implementation illustrated, columns with column weights greater than three would require a higher number of clock cycles.

In one example, a controller (not specifically shown in system 600) causes CNs to be loaded into CN buffers 620 from CN RAM 610 for a computation. The information from the buffers can be added (the summing block) to create partial sum 630. The information can be iteratively computed based on the number of bits provided. Barrel shifter 632 can shift the sum for different iterations. The barrel shifter can rotate the circulant buffer. The shifting and adding can continue until all bits of the computation are calculated and the partial sum is provided to complete sum 640. System 600 computes complete sum 640 from the multiple partial sums.

In one example, system 600 can support an irregular LDPC code. An irregular LDPC code will have a different number of CNs active for a specific computation. Consider that most computations include two or three active CNs, which can be computed with the buffers in CN buffers 620. The additional CN buffer 4 can allow for a fourth CN. In such a case, the partial sum of CN buffers 620 can be passed to complete sum 640, and shifted with barrel shifter 642 and subtracted (the subtracting block) to adjust the sum. The results can be written back into CN buffers 620 and the iteration completed by cycling through until all bits have been computed. It will be understood that going from a regular matrix to an irregular matrix has advantages on flexibility of design but is not expected to scale linearly. If a regular matrix with 3 active CNs per column can be processed in 3 cycles, processing 4 CNs on a given operation will take more than 4 cycles to process.

In one example, the CNS architecture of system 600 can process multiple columns incidence by incidence. It will be understood that the architecture is not limited to processing one circulant column at a time. In one example, system 600 can include replicated logic, similar to known existing architectures, and speed up the processing of the codeword. In one example, with the CNS architecture of system 600 the connections (H matrix) can be stored in a ROM (read only memory), or alternatively can be stored in a RAM, either of which can be updated after deployment of the device. In traditional architectures, the matrix connections need to be hard-coded into the wiring of the decoder. Thus, the CNS architecture provides an advantage of upgradeability or changeability over traditional decoders.

The depth of CN RAM 610 will depend on how many addressable locations there are in the computing device in which system 600 is implemented. For example, the depth can be 35, 36, 37, 40, or some other number. The number of words the RAM can store depends on the specific implementation for the decoder depending on the implementation.

Consider an example of a 16 KB decoder with 300 circulant columns, a circulant size 512, and 37 circulant rows. The approximate gate count for a traditional architecture with a speed up 1 is approximately 4M gates. Nearly half of the four million gates would be spent for storing check nodes in flip flops (meaning 2M gates for CN storage). A CNS architecture in accordance with system 600 can store 37 check nodes in SRAM and use only 3 check nodes in flip flops. Such an implementation could apply a RAM with depth 37, which would cost about four gates for storing a bit. In such an implementation, the RAM area utilization would be approximately 80% compared to a logic area utilization of 60%, giving an additional 25% gate count reduction. Therefore, the CNS architecture can potentially store the check nodes in (3/37×10+37/37×4)/10×2 million=0.96M gates for CN storage. This is a reduction of 1.04M gates (~50%) for check nodes. The addition of barrel shifters as in system 600 would cost approximately 200 k gates, making a total of about 1.2M gates as compared to 2M gates for CN storage. The reduction of approximately 40% of the 50% area for CN storage results in approximately 20% area reduction in the overall size of the decoder.

For an implementation with LDPC codes having lower circulant size, the area savings can be higher (e.g., up to approximately 40% area savings) since the number of circulant rows increases, translating to a deeper SRAM. A deeper RAM is much more area efficient in comparison to a shallow RAM of the same capacity. It will be understood that the latency of such a configuration would be higher, but a system architect can evaluate the tradeoff in area versus latency and design accordingly.

Figure 7:
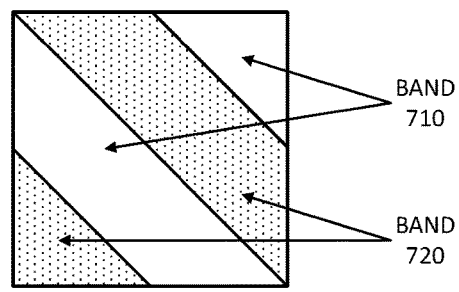
FIG. 7 is a block diagram of an example of a bounded or constrained circulant.

FIG. 7 is a block diagram of an example of a bounded or constrained circulant. Constrained circulant 700 represents a circulant that has constraints on where non-zero elements can exist.

As described above, LDPC decoding with a min-sum algorithm, belief propagation (SPA) algorithm, or bit flipping algorithm, the decoder system typically passes messages between variable bit nodes (H matrix columns) and parity check nodes (H matrix rows). The exchange of messages takes multiple iterations. In one example, the system applies message passing between variable and check nodes that corresponds to a square sub-matrix or circulant in one sub-iteration. In one example, a subset of variable nodes from each circulant row is processed in a sub-iteration.

When variable nodes are processed in using circulants, multiple check nodes will receive messages from the variable nodes and will be updated. A somewhat random arrangement of check nodes will be updated, meaning store the check nodes in flip-flops provides latency advantages. However, given that flip-flops are typically larger than SRAMs, the use of flip-flops increases the amount of die area needed to implement a decoder.

Circulant 700 has constrained areas in which the ones or non-zero elements in each circulant can placed. When all non-zero elements fall within a diagonal band of locations, the number of connections needed can be smaller, resulting in lower area utilization. In circulant 700, the shaded areas indicated as bands 720 represent allowed locations for non-zero elements. The non-shaded areas indicated as bands 710 represent areas that will only contain zeros.

It will be understood that circulant 700 sacrifices some flexibility in the code implementation to limit the circulant to bands 720. An LDPC H-matrix in accordance with circulant 700 would have exponents that all fall within the confined range. The diagonal nature of bands 720 indicates the use of the identity matrix in the circulant, with the offsets constrained to the banded areas. In one example, the identity matrix circulant is constrained between zero and one-half of a size of the circulant. Thus, only half the circulant area could actually contain a non-zero element. A constrained area of greater than ½ can increase the flexibility of the code used at the expense of more area. A constrained area of less than ½ will decrease the flexibility to save more area.

Figure 8:
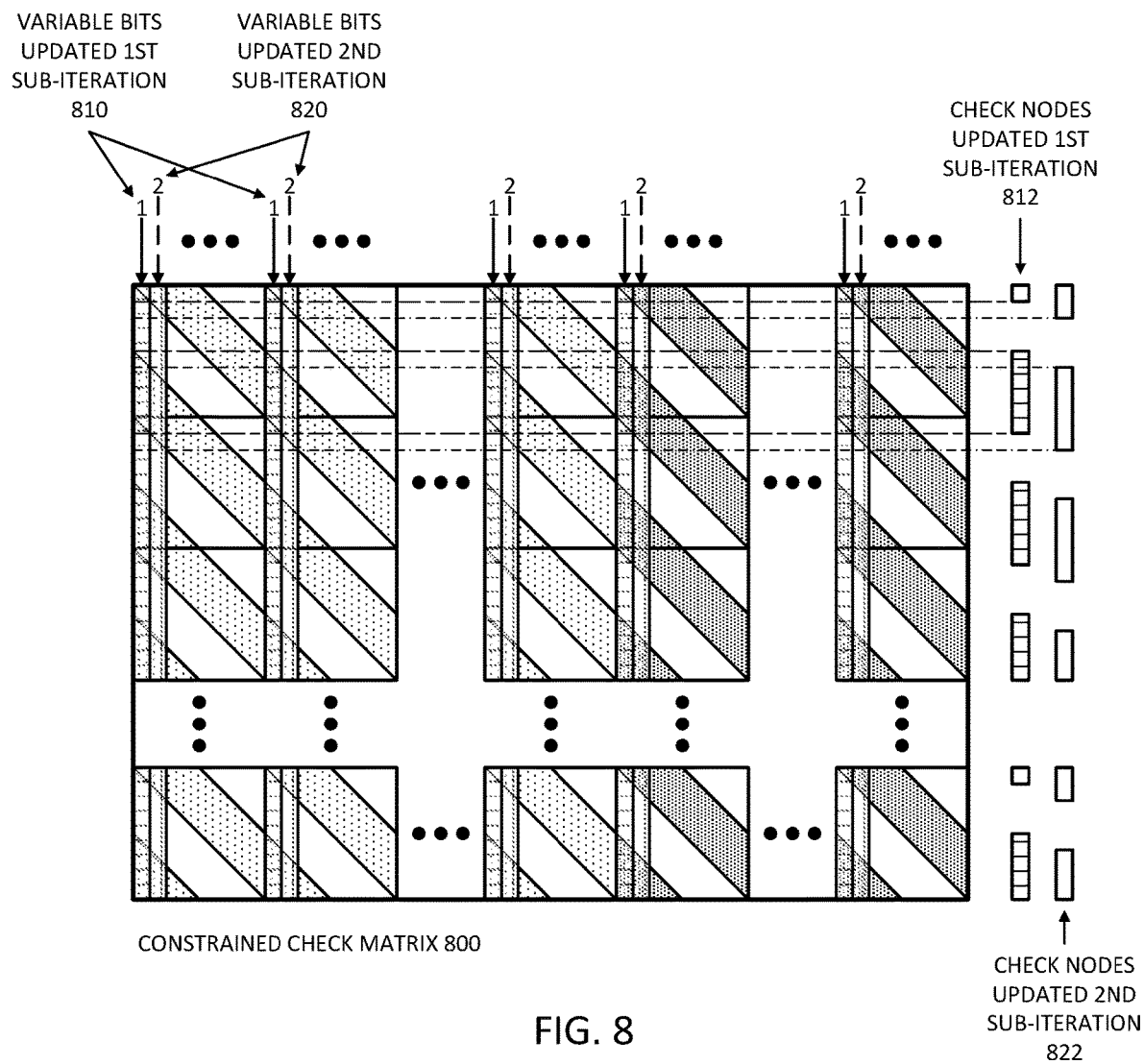
FIG. 8 is a block diagram of an example of a quasi-cyclic parity check matrix with constrained circulants.

FIG. 8 is a block diagram of an example of a quasi-cyclic parity check matrix with constrained circulants. Constrained check matrix 800 represents an example of a matrix in accordance with matrix 310 of FIG. 3, with constrained circulants in accordance with circulant 700 of FIG. 7. A submatrix where there is only one non-zero element in each column of a given circulant can be thought of as a rotated identity matrix or permutation matrix. In one example of matrix 800, the circulants are constrained to only allow permutation matrices that are offset by the identity matrix within a given range. The given range or the bounded or constrained area is illustrated by the shading.

By imposing a restriction to the circulants, matrix 800 is less flexible in designing H matrices with high girth, which is good for reducing trapping sets and error floors. However, the penalty of the lower flexibility is marginal for longer codewords, where an application of matrix 800 can provide more advantage. Matrix 800 has a higher corresponding predictability in which check nodes are updated in a given sub-iteration. In one example where the range is restricted to the range of 0 to Q/2, half of the check nodes will not be updated within a sub-iteration. Note that Q/2 is a representative value. The range can be any fraction of Q. A smaller range results in greater silicon area reduction, but makes it more challenging to construct an H matrix with a good girth. In one example, the check nodes that will not be updated within a sub-iteration can be stored in a volatile memory (e.g., a large SRAM).

The columns identified by 1, 2, . . . , represent, respectively, variable bits updated by the first sub-iteration 810, variable bits updated by the second sub-iteration 820, and so forth. To the right of matrix 800 the diagram illustrates how the constraint on the circulants constrains the check nodes that will be updated. More specifically, check nodes updated on the first sub-iteration 812 correspond to the variable nodes updated on the first sub-iteration 810, and check nodes updated on the second sub-iteration 822 correspond to the variable nodes updated on the second sub-iteration 820. Other sub-iterations are not illustrated.

Figure 9:
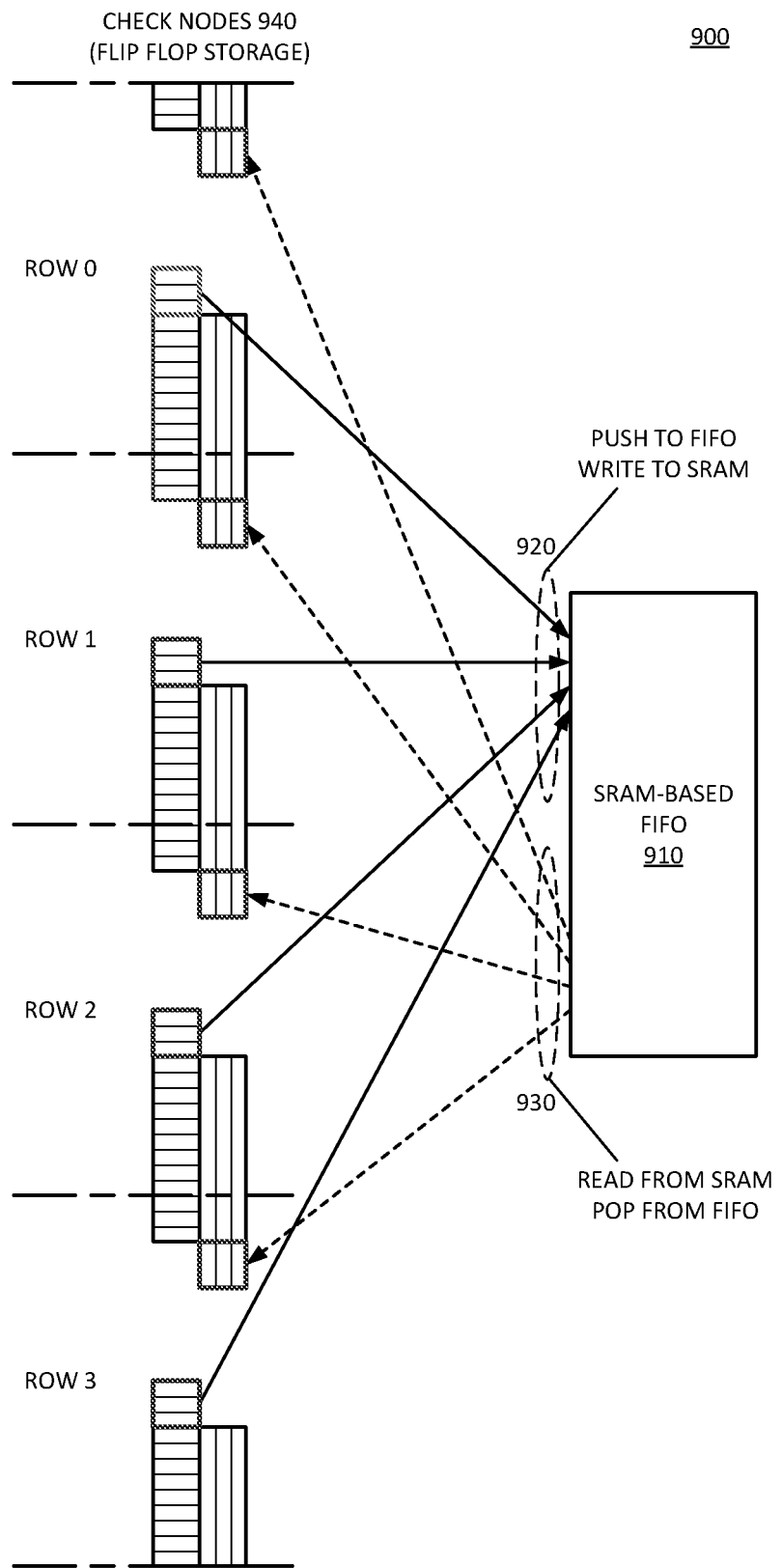
FIG. 9 is a block diagram of an example of a parity check system in which check nodes are swapped between memory and latches depending on whether they are active or inactive.

FIG. 9 is a block diagram of an example of a parity check system in which check nodes are swapped between memory and latches depending on whether they are active or inactive. System 900 illustrates a disposition of check node storage for an implementation of matrix 800 of FIG. 8.

The check nodes are traditionally stored in flip-flops that form a rotating shift register. In one example as illustrated, in each sub-iteration, one check node that will not be used for a long time will be removed from the shift register and written to the SRAM, while another check node that will soon be used will be read from the SRAM and added to the shift register.

More specifically, check nodes 940 represent check nodes in flip flops or shift registers. The separation into rows indicates the rows in accordance with a separation into circulants, but it will be understood that check nodes in adjacent circulants can be active in the same transaction when implementing a system with constrained circulants. The blocks with horizontal line shading represent the check nodes active for a first sub-iteration, and the blocks with the vertical line shading represent the check nodes active for a second sub-iteration, or an immediately consecutive sub-iteration. The "first" and "second" iterations do not necessarily refer to the very first and second sets of check nodes, but can refer to a snapshot where zero or more operations for previous sub-iterations could have been performed.

SRAM-based FIFO (first in first out buffer) 910 (or simply "FIFO 910" subsequently) represents a volatile memory to store selected check nodes. FIFO 910 can store selected check nodes and then provide the check nodes to latching circuitry for a computation. The arrows at 920 represent check nodes 940 that will be pushed to FIFO 910 and written to the SRAM. The arrows at 930 represent check nodes that will be read from the SRAM and popped from FIFO 910 to the shift registers to become active check nodes 940 for a subsequent computation.

Figure 10:
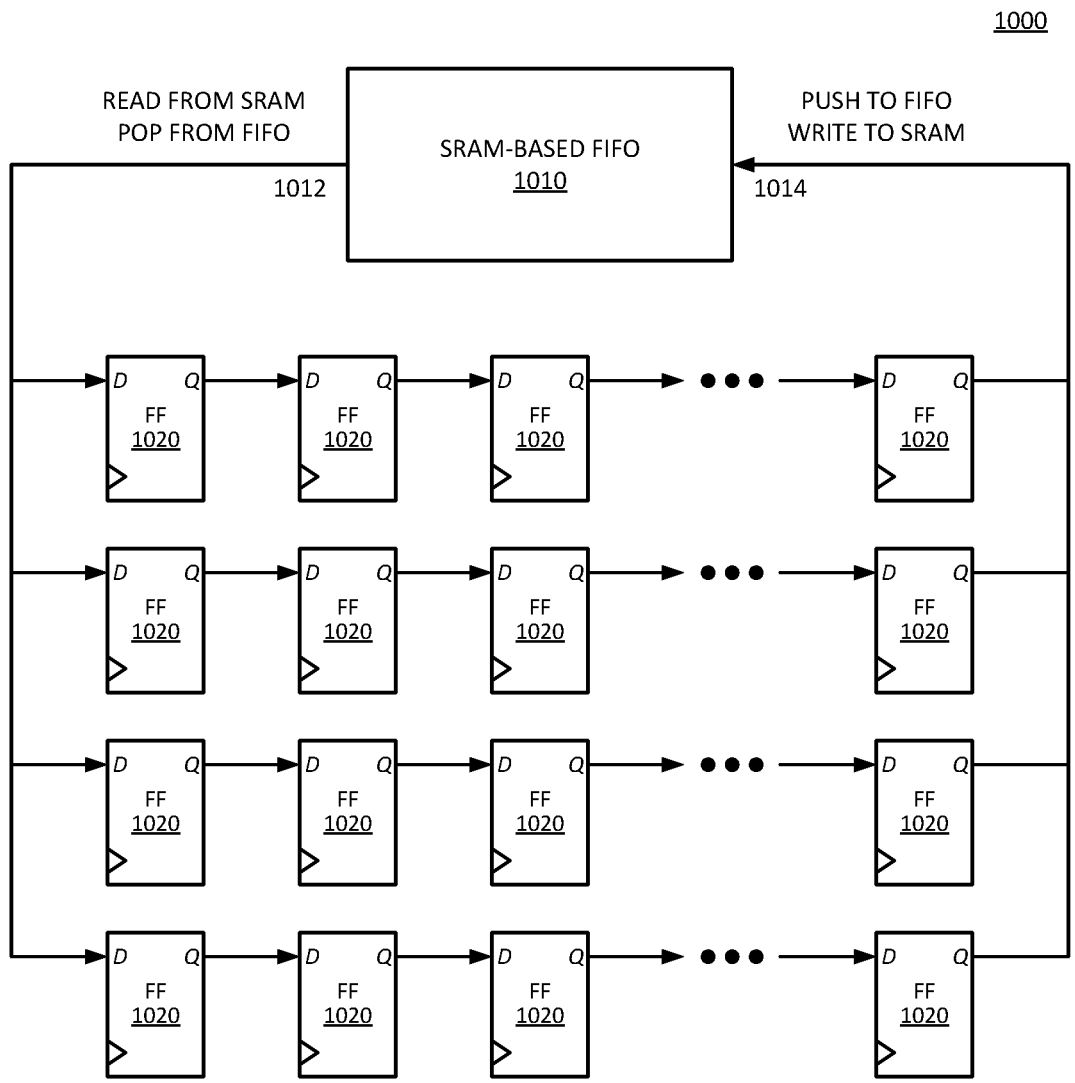
FIG. 10 is a block diagram of an example of a CNS architecture with flip-flops and a random access memory device.

FIG. 10 is a block diagram of an example of a CNS architecture with flip-flops and a random access memory device. System 1000 provides an example of a schematic design to implement a system in accordance with system 900 of FIG. 9 for an LDPC decoder. While system 900 specifically illustrates an implementation for constrained circulants, it will be understood more broadly that the implementation can be applied for a decoder in which check nodes are traded between latching circuitry and volatile memory based on whether they are active for a computation. Thus, the implementations illustrated in both FIG. 9 and FIG. 10 can apply to matrices that do not include constrained circulants.

System 1000 includes SRAM 1010 to implement a FIFO buffer and shift register in flip-flops, or more specifically, multiple groups of flip flops, where a group of flip flops stores a bit and its information for matrix computations. Thus, each check node can include multiple flip flops to store a check node. Flip flops (FF) 1020 represent the flip flops to store the active check nodes for system 1000. Point 1012 can be thought of as the check nodes ready to exit the FIFO of SRAM 1010, and point 1014 can be thought of as the check nodes being returned to the FIFO. As illustrated, point 1012 is to read from SRAM 1010 to pop the CNs from the FIFO, and point 1014 is to push CNs to the FIFO to write to SRAM 1010.

It is anticipated that an architecture in accordance with system 1000 will provide a large gate count savings from storing check node information in SRAM 1010 instead of all CNs in flip-flops 1020. The gate count savings increases as the number of check nodes grows for larger LDPC codeword sizes. If SRAM 1010 can be 10 times denser storage than FF 1020, as would be typical, the check node storage can be reduced by approximately 45%, resulting in an overall reduction of 22.5% silicon area for the LDPC decoder by use of constrained circulants.

In one example of a practical implementation of system 1000, the check nodes stored in flip-flops 1020 can be placed in a wide circle, encompassing related combinational logic around each check node. Connections to the write port of SRAM 1010 can be at one end of the circle, nearby a connection to the read port for the same SRAM 1010. In one example, the SRAM (or register file) could have a capacity of approximately the number of LDPC code parity bits times 17, with a depth of the SRAM around 100.

Figure 11:
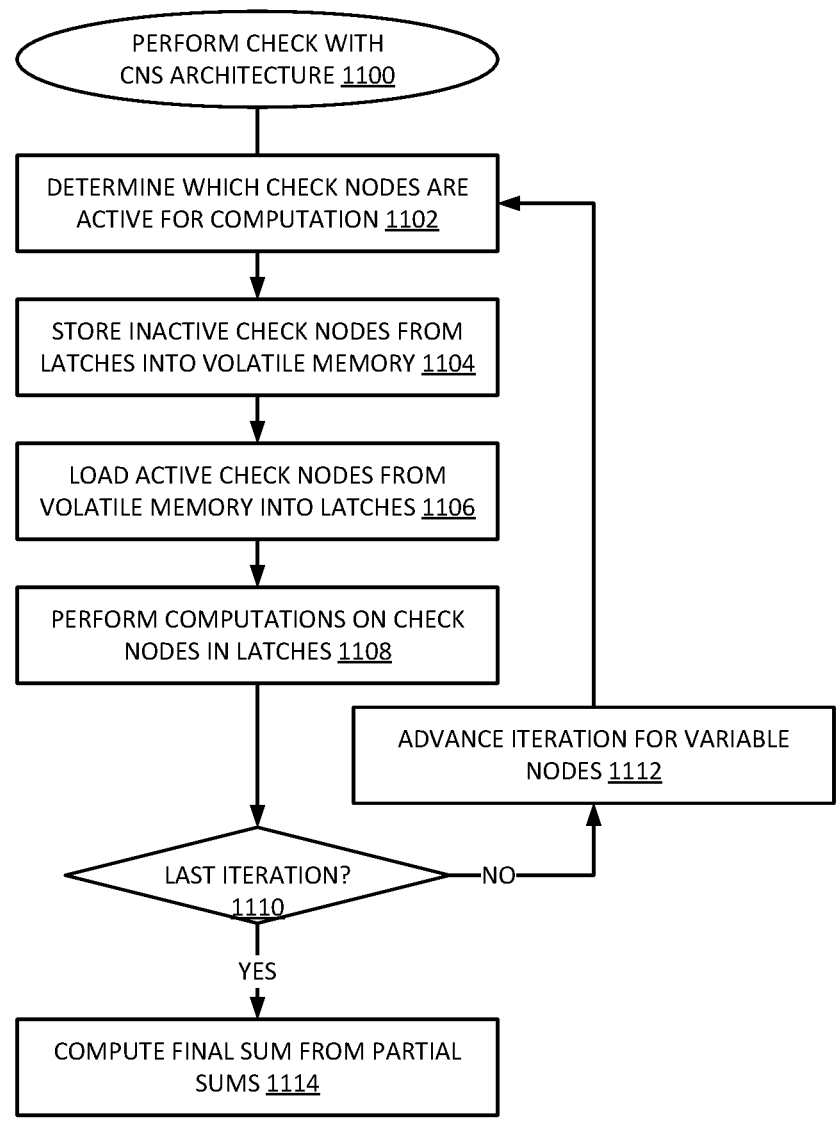
FIG. 11 is a flow diagram of an example of a process for performing parity check with a CNS architecture.

FIG. 11 is a flow diagram of an example of a process for performing parity check with a CNS architecture. Process 1100 can be implemented by any example of a system with a CNS architecture herein.

In one example, the controller that controls or executes decoder operation can determine which check nodes will be active for a computation, at 1102. In one example, the check nodes that will be active are determined in accordance with constrained circulants. In one example, a decoder H-matrix does not have constrained circulants.

In one example, the controller can store inactive check nodes from the latching circuitry into volatile memory, at 1104. In one example, the controller loads active check nodes from the volatile memory into the latching circuitry, at 1106. The controller can perform computations with the check node data in the latching circuitry, at 1108.

If the computation is not the last iteration or sub-iteration of the computation to be performed, at 1110 NO branch, the controller can advance the iteration for the variable nodes, at 1112. In one example, advancing to the next sub-iteration can result in different check nodes being active for the subsequent computation. If no check nodes will be changed, the next computation can be performed without swapping check nodes, but simply computing a subsequent partial computation.

After all sub-iterations are performed and all partial computations are made, the controller can determine that the last iteration has occurred, at 1110 YES branch. In one example, the controller computes a final sum or a final computation from the partial sums or partial computations, at 1114.

Figure 12:
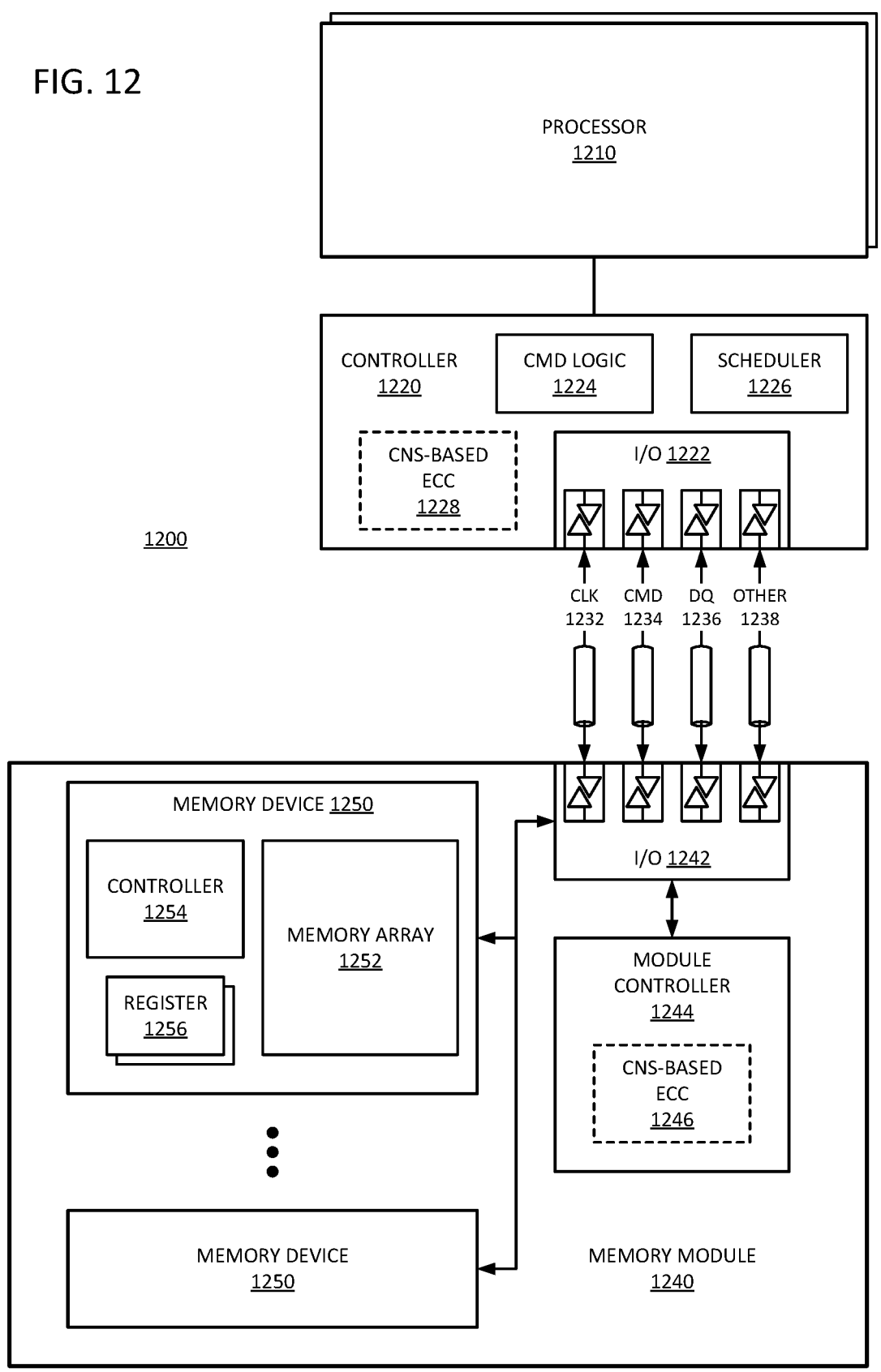
FIG. 12 is a block diagram of an example of a system with a memory subsystem in which a check node storage architecture can be implemented.

FIG. 12 is a block diagram of an example of a system with a memory subsystem in which a check node storage architecture can be implemented. System 1200 includes a processor and elements of a memory subsystem in a computing device. System 1200 can include a CNS based ECC decoder in accordance with any example of a CNS architecture, such as described with respect to system 100, system 600, system 900, or others.

In one example, controller 1220 of the host system includes CNS-based ECC 1228, which includes a decoder at the host side. The CNS based ECC of the host controller can apply a CNS architecture to implement ECC for memory storage. As applied in controller 1220, the ECC would be system-level ECC that applies a CNS architecture to data received from memory device 1250. In one example, module controller 1244 of memory module 1240 includes CNS-based ECC 1246, which includes a decoder at the memory side. The CNS based ECC of the module controller can apply a CNS architecture to implement ECC for memory storage. As applied in controller 1220, the ECC would be module level, which can apply a CNS architecture for volatile or nonvolatile memory on the module board. For example, CNS based ECC 1246 can be to apply ECC for a byte addressable 3DXP nonvolatile memory on memory module 1240.

Whether at the host or at the memory device, a controller can dynamically control the CNS architecture, including swapping check nodes between a volatile memory array and latching circuitry based on whether the check nodes are active for an H-matrix operation of an LDPC code. It will be understood that the volatile memory and latching circuitry are not specifically illustrated in system 1200, but are included in CNS-based ECC 1228 or CNS-based ECC 1246, depending on how the decoder is implemented.

Processor 1210 represents a processing unit of a computing platform that may execute an operating system (OS) and applications, which can collectively be referred to as the host or the user of the memory. The OS and applications execute operations that result in memory accesses. Processor 1210 can include one or more separate processors. Each separate processor can include a single processing unit, a multicore processing unit, or a combination. The processing unit can be a primary processor such as a CPU (central processing unit), a peripheral processor such as a GPU (graphics processing unit), or a combination. Memory accesses may also be initiated by devices such as a network controller or hard disk controller. Such devices can be integrated with the processor in some systems or attached to the processer via a bus (e.g., PCI express), or a combination. System 1200 can be implemented as an SOC (system on a chip), or be implemented with standalone components.

Controller 1220 represents one or more controller circuits or devices for system 1200. Controller 1220 represents control logic that generates memory access commands in response to the execution of operations by processor 1210. Controller 1220 accesses one or more memory devices 1250. Memory devices 1250 can include volatile memory devices or nonvolatile memory devices, or a combination of volatile and nonvolatile memory. In one example, memory devices 1250 are organized and managed as different channels, where each channel couples to buses and signal lines that couple to multiple memory devices in parallel. Each channel is independently operable. Thus, each channel is independently accessed and controlled, and the timing, data transfer, command and address exchanges, and other operations are separate for each channel. Coupling can refer to an electrical coupling, communicative coupling, physical coupling, or a combination of these. Physical coupling can include direct contact. Electrical coupling includes an interface or interconnection that allows electrical flow between components, or allows signaling between components, or both. Communicative coupling includes connections, including wired or wireless, that enable components to exchange data.

In one example, each controller 1220 manages a separate memory channel, although system 1200 can be configured to have multiple channels managed by a single controller, or to have multiple controllers on a single channel. In one example, controller 1220 is part of processor 1210, such as logic implemented on the same die or implemented in the same package space as the processor.

Controller 1220 includes I/O interface logic 1222 to couple to a memory bus, such as a memory channel as referred to above. I/O interface logic 1222 (as well as I/O interface logic 1242 of memory module 1240) can include pins, pads, connectors, signal lines, traces, or wires, or other hardware to connect the devices, or a combination of these. I/O interface logic 1222 can include a hardware interface. As illustrated, I/O interface logic 1222 includes at least drivers/transceivers for signal lines. Commonly, wires within an integrated circuit interface couple with a pad, pin, or connector to interface signal lines or traces or other wires between devices. I/O interface logic 1222 can include drivers, receivers, transceivers, or termination, or other circuitry or combinations of circuitry to exchange signals on the signal lines between the devices. The exchange of signals includes at least one of transmit or receive. While shown as coupling I/O 1222 from controller 1220 to I/O 1242 of memory module 1240, it will be understood that memory devices 1250 can be accessed in parallel, and each memory device would include I/O interfaces to I/O 1242.

The bus between controller 1220 and memory devices 1250 can be implemented as multiple signal lines coupling memory controller 1220 to memory devices 1250. The bus may typically include at least clock (CLK) 1232, command/address (CMD) 1234, and write data (DQ) and read data (DQ) 1236, and zero or more other signal lines 1238. In one example, a bus or connection between memory controller 1220 and memory can be referred to as a memory bus. The signal lines for CMD can be referred to as a "C/A bus" (or ADD/CMD bus, or some other designation indicating the transfer of commands (C or CMD) and address (A or ADD) information) and the signal lines for write and read DQ can be referred to as a "data bus." In one example, independent channels have different clock signals, C/A buses, data buses, and other signal lines. Thus, system 1200 can be considered to have multiple "buses," in the sense that an independent interface path can be considered a separate bus. It will be understood that in addition to the lines explicitly shown, a bus can include at least one of strobe signaling lines, alert lines, auxiliary lines, or other signal lines, or a combination. It will also be understood that serial bus technologies can be used for the connection between controller 1220 and memory devices 1250. An example of a serial bus technology is 12B10B encoding and transmission of high-speed data with embedded clock over a single differential pair of signals in each direction. In one example, CMD 1234 represents signal lines shared in parallel with multiple memory devices. In one example, multiple memory devices share encoding command signal lines of CMD 1234, and each has a separate chip select (CS_n) signal line to select individual memory devices.

In one example, memory devices 1250 and memory controller 1220 exchange data over the data bus in a burst, or a sequence of consecutive data transfers. The burst corresponds to a number of transfer cycles, which is related to a bus frequency. In one example, the transfer cycle can be a whole clock cycle for transfers occurring on a same clock or strobe signal edge (e.g., on the rising edge). In one example, every clock cycle, referring to a cycle of the system clock, is separated into multiple unit intervals (UIs), where each UI is a transfer cycle. For example, double data rate transfers trigger on both edges of the clock signal (e.g., rising and falling). A burst can last for a configured number of UIs, which can be a configuration stored in a register, or triggered on the fly. For example, a sequence of eight consecutive transfer periods can be considered a burst length 8 (BL8), and each memory device 1250 can transfer data on each UI. Thus, a ×8 memory device operating on BL8 can transfer 64 bits of data (8 data signal lines times 8 data bits transferred per line over the burst). It will be understood that this simple example is merely an illustration and is not limiting.

Memory devices 1250 represent memory resources for system 1200. Memory array 1252 represents the memory resources, including memory cells or storage cells that hold the data. For a Write operation, an individual memory device 1250 can write a portion of an overall data word in a parallel configuration or the whole word in a different configuration. Similarly, for a Read operation, an individual memory device 1250 can fetch a portion of the overall data word or the entire data word.

In one example, memory devices 1250 are disposed directly on a motherboard or host system platform (e.g., a PCB (printed circuit board) on which processor 1210 is disposed) of a computing device. In one example, memory devices 1250 can be organized into memory module 1240. In one example, memory module 1240 represents a dual inline memory module (DIMM). In one example, memory module 1240 represent other organization of multiple memory devices to share at least a portion of access or control circuitry, which can be a separate circuit, a separate device, or a separate board (e.g., PCB) from the host system platform. In one example, memory devices 1250 may be incorporated into the same package as memory controller 1220, such as by techniques such as multi-chip-module (MCM), package-on-package, through-silicon via (TSV), or other techniques or combinations. Similarly, in one example, multiple memory devices 1250 may be incorporated into memory modules 1240, which themselves may be incorporated into the same package as memory controller 1220. It will be appreciated that for these and other implementations, memory controller 1220 may be part of host processor 1210.

Memory module 1240 includes module controller 1244, which represents control logic on the memory module board, such as a controller or register device on a memory module PCB. In one example, module controller 1244 represents a register clock device or other application specific integrated circuit (ASIC) device. Module controller 1244 can control the exchange of commands to memory devices 1250. In one example, module controller 1244 manages ECC on memory module 1240. The module-level ECC can be ECC for a nonvolatile memory device on the module, for example.

In one example, memory devices 1250 include one or more registers 1256. Register 1256 represents one or more storage devices or storage locations that provide configuration or settings for the operation of the memory device. In one example, register 1256 can provide a storage location for memory device 1250 to store data for access by memory controller 1220 as part of a control or management operation. In one example, register 1256 includes one or more Mode Registers. The configuration of locations within register 1256 can configure memory device 1250 to operate in different "modes," where command information can trigger different operations within memory device 1250 based on the mode.

Memory device 1250 includes controller 1254, which represents control logic within the memory device to control internal operations within the memory device. For example, controller 1254 decodes commands sent by memory controller 1220 and generates internal operations to execute or satisfy the commands. Controller 1254 can be referred to as an internal controller, and is separate from memory controller 1220 of the host.

Referring again to memory controller 1220, memory controller 1220 includes command (CMD) logic 1224, which represents logic or circuitry to generate commands to send to memory devices 1250. The generation of the commands can refer to the command prior to scheduling, or the preparation of queued commands ready to be sent. Generally, the signaling in memory subsystems includes address information within or accompanying the command to indicate or select one or more memory locations where the memory devices should execute the command. In response to scheduling of transactions, memory controller 1220 can issue commands via I/O 1222 to cause memory device 1250 to execute the commands. In one example, controller 1254 of memory device 1250 receives and decodes command and address information received via I/O 1242 from memory controller 1220. Based on the received command and address information, controller 1254 can control the timing of operations of the logic and circuitry within memory device 1250 to execute the commands. Controller 1254 is responsible for compliance with standards or specifications within memory device 1250, such as timing and signaling requirements. Memory controller 1220 can implement compliance with standards or specifications by access scheduling and control.

Memory controller 1220 includes scheduler 1226, which represents logic or circuitry to generate and order transactions to send to memory device 1250. From one perspective, the primary function of memory controller 1220 could be said to schedule memory access and other transactions to memory device 1250. Such scheduling can include generating the transactions themselves to implement the requests for data by processor 1210 and to maintain integrity of the data (e.g., such as with commands related to refresh). Transactions can include one or more commands, and result in the transfer of commands or data or both over one or multiple timing cycles such as clock cycles or unit intervals. Transactions can be for access such as read or write or related commands or a combination, and other transactions can include memory management commands for configuration, settings, data integrity, or other commands or a combination.

Reference to memory devices can apply to different memory types. Memory devices often refers to volatile memory technologies. Volatile memory is memory whose state (and therefore the data stored on it) is indeterminate if power is interrupted to the device. Nonvolatile memory refers to memory whose state is determinate even if power is interrupted to the device. Dynamic volatile memory requires refreshing the data stored in the device to maintain state. One example of dynamic volatile memory includes DRAM (dynamic random access memory), or some variant such as synchronous DRAM (SDRAM). A memory subsystem as described herein may be compatible with a number of memory technologies, such as DDR4 (DDR version 4, JESD79, initial specification published in September 2012 by JEDEC), LPDDR4 (low power DDR version 4, JESD209-4, originally published by JEDEC in August 2014), WIO2 (Wide I/O 2 (WideIO2), JESD229-2, originally published by JEDEC in August 2014), HBM (high bandwidth memory DRAM, JESD235A, originally published by JEDEC in November 2015), DDR5 (DDR version 5, currently in discussion by JEDEC), LPDDR5 (currently in discussion by JEDEC), HBM2 ((HBM version 2), currently in discussion by JEDEC), or others or combinations of memory technologies, and technologies based on derivatives or extensions of such specifications.

In addition to, or alternatively to, volatile memory, in one example, reference to memory devices can refer to a nonvolatile memory device whose state is determinate even if power is interrupted to the device. In one example, the nonvolatile memory device is a block addressable memory device, such as NAND or NOR technologies. Thus, a memory device can also include a future generation nonvolatile devices, such as a three dimensional crosspoint memory device, other byte addressable nonvolatile memory devices, or memory devices that use chalcogenide phase change material (e.g., chalcogenide glass), or resistance-based memory devices that store data based on a resistive state of a cell. In one example, the memory device can be or include multi-threshold level NAND flash memory, NOR flash memory, single or multi-level phase change memory (PCM) or phase change memory with a switch (PCMS), a resistive memory, nanowire memory, ferroelectric transistor random access memory (FeTRAM), magnetoresistive random access memory (MRAM) memory that incorporates memristor technology, or spin transfer torque (STT)-MRAM, or a combination of any of the above, or other memory.

Figure 13:
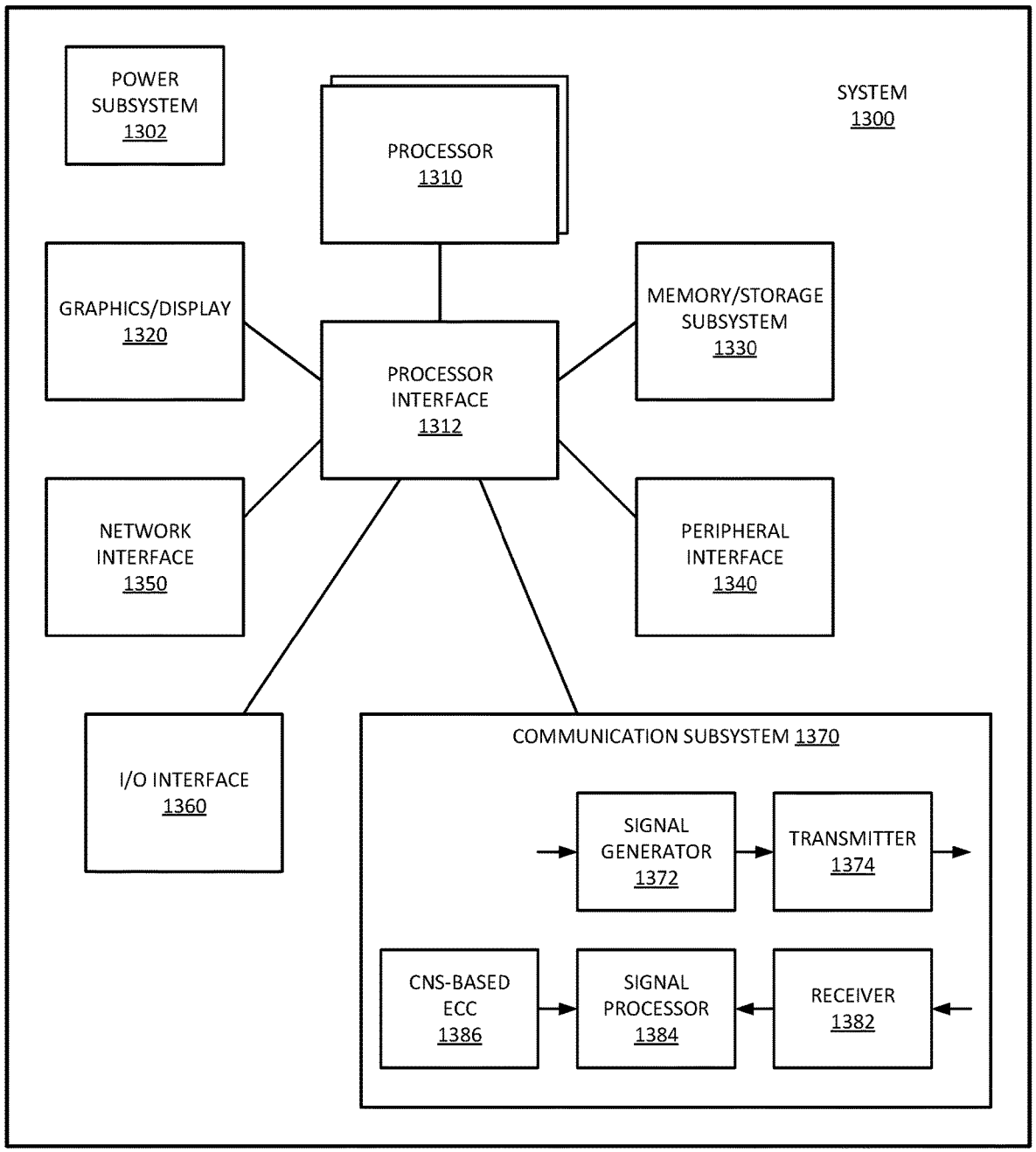
FIG. 13 is a block diagram of an example of a computing system with a memory subsystem in which a check node storage architecture can be implemented.

FIG. 13 is a block diagram of an example of a computing system with a memory subsystem in which a check node storage architecture can be implemented. System 1300 represents a computing device, and can be a laptop computer, a desktop computer, a tablet computer, a server, a gaming or entertainment control system, embedded computing device, or other electronic device. System 1300 can represent a mobile computing device, such as a computing tablet, a mobile phone or smartphone, wearable computing device, or other mobile device, or an embedded computing device. System 1300 includes a processor and elements of a computing device. System 1300 can include a CNS based ECC decoder in accordance with any example of a CNS architecture, such as described with respect to system 100, system 600, system 900, or others.

In one example, system 1300 includes communication subsystem 1370. Communication subsystem 1370 represents communication capability for system 1300. Communication subsystem 1370 represents a communication transceiver with a transmit path and a receive path. As a non-limiting example, communication subsystem 1370 includes signal generator 1372 to generate a communication signal from a source signal (illustrated by the arrow coming into signal generator 1372). Signal generator 1372 can pass the signal to transmitter 1374 for transmission via a communication medium. The communication medium can be wired, wireless, or optical. The transmitter generates a high bandwidth signal.

In one example, communication subsystem 1370 includes a receive path with receiver 1382 to receive a high bandwidth signal via the communication medium. Receiver 1382 passes the signal to signal processor 1384 for processing of the signal. In one example, the receive path includes CNS-based ECC 1386, which includes a decoder with a CNS architecture to implement ECC the received signal. A controller or control logic of communication subsystem 1370 (not specifically illustrated) can dynamically control the CNS architecture, including swapping check nodes between a volatile memory array and latching circuitry based on whether the check nodes are active for an H-matrix operation of an LDPC code. It will be understood that the volatile memory and latching circuitry are not specifically illustrated in system 1300, but are included in CNS-based ECC 1386.

System 1300 includes processor 1310 can include any type of microprocessor, central processing unit (CPU), graphics processing unit (GPU), processing core, or other processing hardware, or a combination, to provide processing or execution of instructions for system 1300. Processor 1310 controls the overall operation of system 1300, and can be or include, one or more programmable general-purpose or special-purpose microprocessors, digital signal processors (DSPs), programmable controllers, application specific integrated circuits (ASICs), programmable logic devices (PLDs), or a combination of such devices.

In one example, system 1300 includes interface 1312 coupled to processor 1310, to interface system components to the processor. In one example, processor interface 1312 is part of processor 1310, or integrated on the same chip as a processor core. Interface 1312 can be integrated as a circuit onto the processor die or integrated as a component on a system on a chip. Graphics/display 1320 represents an interface to graphics components for providing a visual display to a user of system 1300. Graphics/display 1320 can be a standalone component or integrated onto the processor die or system on a chip. In one example, graphics/display 1320 can drive a high definition (HD) or ultra-high definition (UHD) display that provides an output to a user. In one example, display subsystem includes or drives a touchscreen display.

Memory/storage subsystem 1330 provides storage for code to be executed by processor 1310, or data values to be used in executing a routine. Memory/storage subsystem 1330 can include one or more memory devices such as read-only memory (ROM), flash memory, one or more varieties of random access memory (RAM) such as DRAM, or other memory devices, or a combination of such devices. Memory/storage subsystem 1330 can include one or more devices to store data in a nonvolatile manner. The storage device(s) can be or include any conventional medium for storing large amounts of data in a nonvolatile manner, such as one or more magnetic, solid state, or optical based disks, or a combination. Nonvolatile storage holds data in a persistent state (i.e., the value is retained despite interruption of power). With volatile memory, the value or state of the data is indeterminate if power is interrupted).

Memory/storage subsystem 1330 stores and hosts, among other things, an operating system (OS) to provide a software platform for execution of instructions in system 1300, applications or programs that have their own operational logic to perform execution of one or more functions, and processes such as agents or routines that provide auxiliary functions to the OS or an application.

While not specifically illustrated, it will be understood that system 1300 can include one or more buses or bus systems between devices, such as a memory bus, a graphics bus, interface buses, or others. Buses or other signal lines can communicatively or electrically couple components together, or both communicatively and electrically couple the components. Buses can include physical communication lines, point-to-point connections, bridges, adapters, controllers, or other circuitry or a combination. Buses can include, for example, one or more of a system bus, a Peripheral Component Interconnect (PCI) bus, a HyperTransport or industry standard architecture (ISA) bus, a small computer system interface (SCSI) bus, a universal serial bus (USB), or other bus, or a combination.

Peripheral interface 1340 represents hardware interfaces and connectors, as well as software components (e.g., drivers, protocol stacks) to make peripheral connections. A peripheral device refers to a device that connects to system 1300 to send data to the device or receive data from the device. In addition to a proprietary docking connector or other proprietary connection hardware, system 1300 can make peripheral connections via peripheral interface 1340 with common or standards-based connectors. Common types can include a Universal Serial Bus (USB) connector (which can include any of a number of different hardware interfaces), DisplayPort including MiniDisplayPort (MDP), High Definition Multimedia Interface (HDMI), or other type.

Network interface 1350 provides system 1300 the ability to communicate with remote devices (e.g., servers or other computing devices) over one or more networks. Network interface 1350 can include hardware (e.g., wired hardware, wireless hardware, or a combination of the two) and software components (e.g., drivers, protocol stacks) to enable system 1300 to communicate with external devices. Network interface 1350 can include an Ethernet adapter, wireless interconnection components, cellular network interconnection components, USB (universal serial bus), or other wired or wireless standards-based or proprietary interfaces. Network interface 1350 can exchange data with a remote device, which can include sending data stored in memory or receiving data to be stored in memory.

In one example, system 1300 includes one or more input/output (I/O) interface(s) 1360. I/O interface 1360 can include one or more interface components through which a user interacts with system 1300 (e.g., audio, alphanumeric, tactile/touch, or other interfacing).

Power subsystem 1302 provides power to the components of system 1300. More specifically, power subsystem can include a power source to interface with one or multiple power supplies. A power supply can include an AC to DC (alternating current to direct current) adapter to plug into a wall outlet. Such AC power can be renewable energy (e.g., solar power) power source. In one example, the power source includes a DC power source, such as an external AC to DC converter. In one example, the power source or power supply includes wireless charging hardware to charge via proximity to a charging field. In one example, power the source can include an internal battery or fuel cell source. Power subsystem 1302 can also include power management to manage battery power usage, charging of the battery, power saving operation, or other functions.

In general with respect to the descriptions herein, in one example, an apparatus includes: a volatile memory array to store inactive check nodes for a low-density parity-check (LDPC) decoder; latching circuitry to store active check nodes for the LDPC decoder; and a controller to dynamically move check nodes between the volatile memory array and the latching circuitry based on whether the check nodes are active for an H-matrix operation of an LDPC code.

In one example, the volatile memory array comprises a synchronous random access memory (SRAM) array. In one example, the latching circuitry comprises multiple groups of latches, where a group of latches is to store an active check node. In one example, the latching circuitry comprises multiple groups of flip-flops, where a group of flip-flops is to store an active check node. In one example, the active check nodes comprise check nodes having an offset of an identity matrix circulant constrained for the check nodes of the LDPC decoder. In one example, the identity matrix circulant is constrained between zero and one-half of a size of the circulant. In one example, the LDPC decoder comprises an LDPC decoder of a memory subsystem. In one example, the controller comprises a controller of a printed circuit board (PCB) of a memory module having multiple memory dies. In one example, the LDPC decoder comprises an LDPC decoder of a communication subsystem. In one example, the controller comprises a controller of an optical communication transceiver.

In general with respect to the descriptions herein, in one example, a system includes: a receiver to receive a high bandwidth signal; and a low-density parity-check (LDPC) decoder to apply error correction to the received high bandwidth signal, the decoder including a synchronous random access memory (SRAM) array to store inactive check nodes for the LDPC decoder; flip-flops to store active check nodes for the LDPC decoder; and a controller to dynamically move check nodes between the SRAM array and the flip-flops based on whether the check nodes are active for an H-matrix operation of an LDPC code.

In one example, the flip-flops comprise multiple groups of flip-flops, where a group of flip-flops is to store an active check node. In one example, the active check nodes comprise check nodes having an offset of an identity matrix circulant constrained for the check nodes of the LDPC decoder. In one example, the identity matrix circulant is constrained between zero and one-half of a size of the circulant. In one example, receiver is to receive memory data, and wherein the LDPC decoder comprises an LDPC decoder of a memory subsystem. In one example, the controller comprises a controller of a printed circuit board (PCB) of a memory module having multiple memory dies. In one example, receiver is to receive optical communication, and wherein the LDPC decoder comprises an LDPC decoder of a communication subsystem. In one example, the controller comprises a controller of an optical communication transceiver. In one example, the system further comprising one or more of: a host processor device coupled to the receiver; a display communicatively coupled to a host processor; a network interface communicatively coupled to a host processor; or a battery to power the system.

Flow diagrams as illustrated herein provide examples of sequences of various process actions. The flow diagrams can indicate operations to be executed by a software or firmware routine, as well as physical operations. A flow diagram can illustrate an example of the implementation of states of a finite state machine (FSM), which can be implemented in hardware and/or software. Although shown in a particular sequence or order, unless otherwise specified, the order of the actions can be modified. Thus, the illustrated diagrams should be understood only as examples, and the process can be performed in a different order, and some actions can be performed in parallel. Additionally, one or more actions can be omitted; thus, not all implementations will perform all actions.

To the extent various operations or functions are described herein, they can be described or defined as software code, instructions, configuration, and/or data. The content can be directly executable ("object" or "executable" form), source code, or difference code ("delta" or "patch" code). The software content of what is described herein can be provided via an article of manufacture with the content stored thereon, or via a method of operating a communication interface to send data via the communication interface. A machine readable storage medium can cause a machine to perform the functions or operations described, and includes any mechanism that stores information in a form accessible by a machine (e.g., computing device, electronic system, etc.), such as recordable/non-recordable media (e.g., read only memory (ROM), random access memory (RAM), magnetic disk storage media, optical storage media, flash memory devices, etc.). A communication interface includes any mechanism that interfaces to any of a hardwired, wireless, optical, etc., medium to communicate to another device, such as a memory bus interface, a processor bus interface, an Internet connection, a disk controller, etc. The communication interface can be configured by providing configuration parameters and/or sending signals to prepare the communication interface to provide a data signal describing the software content. The communication interface can be accessed via one or more commands or signals sent to the communication interface.

Various components described herein can be a means for performing the operations or functions described. Each component described herein includes software, hardware, or a combination of these. The components can be implemented as software modules, hardware modules, special-purpose hardware (e.g., application specific hardware, application specific integrated circuits (ASICs), digital signal processors (DSPs), etc.), embedded controllers, hardwired circuitry, etc.

Besides what is described herein, various modifications can be made to what is disclosed and implementations of the invention without departing from their scope. Therefore, the illustrations and examples herein should be construed in an illustrative, and not a restrictive sense. The scope of the invention should be measured solely by reference to the claims that follow.

What is claimed is:

1. An apparatus comprising:
    a volatile memory array to store inactive check nodes for a low-density parity-check (LDPC) decoder;
    latching circuitry to store active check nodes for the LDPC decoder; and
    a controller to dynamically move check nodes from the volatile memory array to the latching circuitry that are active for an H-matrix operation of an LDPC code and to dynamically move check nodes from the volatile latching circuitry to the volatile memory array that are inactive for the H-matrix operation of the LDPC code.

2. The apparatus of claim 1, wherein the volatile memory array comprises a synchronous random access memory (SRAM) array.

3. The apparatus of claim 1, wherein the latching circuitry comprises multiple groups of latches, where a group of latches is to store an active check node.

4. The apparatus of claim 1, wherein the latching circuitry comprises multiple groups of flip-flops, where a group of flip-flops is to store an active check node.

5. The apparatus of claim 1, wherein the active check nodes comprise check nodes having an offset of an identity matrix circulant constrained for the check nodes of the LDPC decoder.

6. The apparatus of claim 5, wherein the identity matrix circulant is constrained between zero and one-half of a size of the circulant.

7. The apparatus of claim 1, wherein the LDPC decoder comprises an LDPC decoder of a memory subsystem.

8. The apparatus of claim 7, wherein the controller comprises a controller of a printed circuit board (PCB) of a memory module having multiple memory dies.

9. The apparatus of claim 1, wherein the LDPC decoder comprises an LDPC decoder of a communication subsystem.

10. The apparatus of claim 9, wherein the controller comprises a controller of an optical communication transceiver.

11. A system, comprising:
a receiver to receive a high bandwidth signal; and
a low-density parity-check (LDPC) decoder to apply error correction to the received high bandwidth signal, the decoder including
a synchronous random access memory (SRAM) array to store inactive check nodes for the LDPC decoder;
flip-flops to store active check nodes for the LDPC decoder; and
a controller to dynamically move check nodes from the SRAM array to the flip-flops that are active for an H-matrix operation of an LDPC code and to dynamically move check nodes from the flip-flops to the SRAM that are inactive for the H-matrix operation of the LDPC code.

12. The system of claim 11, wherein the flip-flops comprise multiple groups of flip-flops, where a group of flip-flops is to store an active check node.

13. The system of claim 11, wherein the active check nodes comprise check nodes having an offset of an identity matrix circulant constrained for the check nodes of the LDPC decoder.

14. The system of claim 13, wherein the identity matrix circulant is constrained between zero and one-half of a size of the circulant.

15. The system of claim 11, wherein receiver is to receive memory data, and wherein the LDPC decoder comprises an LDPC decoder of a memory subsystem.

16. The system of claim 15, wherein the controller comprises a controller of a printed circuit board (PCB) of a memory module having multiple memory dies.

17. The system of claim 11, wherein receiver is to receive optical communication, and wherein the LDPC decoder comprises an LDPC decoder of a communication subsystem.

18. The system of claim 17, wherein the controller comprises a controller of an optical communication transceiver.

19. The system of claim 11, further comprising one or more of:
a host processor device coupled to the receiver;
a display communicatively coupled to a host processor;
a network interface communicatively coupled to a host processor; or
a battery to power the system.

* * * * *